(12) United States Patent
Crighton et al.

(10) Patent No.: US 11,837,830 B2
(45) Date of Patent: Dec. 5, 2023

(54) HINGED BUSBAR ASSEMBLY

(71) Applicant: MOLEX LLC, Lisle, IL (US)

(72) Inventors: Alan Crighton, Round Rock, TX (US); Robert Dillman, Santa Clara, CA (US)

(73) Assignee: Molex, LLC, Lisle, IL (US)

( * ) Notice: Subject to any disclaimer, the term of this patent is extended or adjusted under 35 U.S.C. 154(b) by 304 days.

(21) Appl. No.: 17/270,059

(22) PCT Filed: Aug. 27, 2019

(86) PCT No.: PCT/US2019/048218
§ 371 (c)(1),
(2) Date: Feb. 22, 2021

(87) PCT Pub. No.: WO2020/046850
PCT Pub. Date: Mar. 5, 2020

(65) Prior Publication Data
US 2021/0328396 A1      Oct. 21, 2021

Related U.S. Application Data

(60) Provisional application No. 62/723,335, filed on Aug. 27, 2018.

(51) Int. Cl.
*H01R 35/04* (2006.01)
*H01R 11/01* (2006.01)
(Continued)

(52) U.S. Cl.
CPC ............. *H01R 35/04* (2013.01); *H01R 11/01* (2013.01); *H02B 1/21* (2013.01); *H02G 5/007* (2013.01); *H01R 4/48* (2013.01); *H05K 7/1457* (2013.01)

(58) Field of Classification Search
None
See application file for complete search history.

(56) References Cited

U.S. PATENT DOCUMENTS

| | | | | |
|---|---|---|---|---|
| 1,168,774 A | * | 1/1916 | Adam | H02B 1/21 |
| | | | | 439/43 |
| 1,698,469 A | * | 1/1929 | Beattie | A41H 33/00 |
| | | | | 223/38 |

(Continued)

FOREIGN PATENT DOCUMENTS

| | | | | |
|---|---|---|---|---|
| CA | 2263639 A1 | * | 9/1999 | ........... H02B 1/21 |
| CN | 200953687 Y | * | 9/2007 | ........... G06F 13/409 |

(Continued)

OTHER PUBLICATIONS

International Preliminary Report on Patentability received for PCT Application No. PCT/US2019/048218, dated Mar. 11, 2021, 8 Pages.

(Continued)

*Primary Examiner* — Timothy J. Dole
*Assistant Examiner* — Muhammed Azam

(57) ABSTRACT

A hinged busbar assembly includes a first mounting busbar configured to be electrically and mechanically connected to the first component at a fixed connection, a second mounting busbar configured to be electrically and mechanically connected to the second component at a fixed connection, and at least two extension busbars extending between the first and second mounting busbars. Adjacent extension busbars are electrically and mechanically connected to each other at a pivotal connection. One of the at least two extension busbars is electrically and mechanically connected to the first mounting busbar at a pivotal connection, and another one of the at least two extension busbars is electrically and mechanically connected to the second mounting busbar at a pivotal connection. Each pivotal connection includes at least one extension extending from each adjacent busbar and at least one electrical contact mounted in each extension, and a pin inserted through the electrical contacts.

20 Claims, 16 Drawing Sheets

(51) Int. Cl.
  *H02G 5/00* (2006.01)
  *H02B 1/21* (2006.01)
  *H05K 7/14* (2006.01)
  *H01R 4/48* (2006.01)

(56) References Cited

U.S. PATENT DOCUMENTS

| | | | | |
|---|---|---|---|---|
| 2,997,627 A * | 8/1961 | Ellegood | ............... | H02B 1/21 174/88 B |
| 3,180,924 A * | 4/1965 | Rowe | ............... | H02G 5/007 174/88 B |
| 3,189,680 A * | 6/1965 | Stanback | ............... | H02G 5/007 174/88 B |
| 3,209,087 A * | 9/1965 | Cole | ............... | H01R 35/04 191/23 R |
| 3,349,291 A * | 10/1967 | Olashaw | ............... | H02B 1/21 33/1 A |
| 3,411,598 A * | 11/1968 | Weaver | ............... | A61G 5/061 280/5.2 |
| 3,459,874 A * | 8/1969 | Fouse | ............... | H02G 5/007 174/68.2 |
| 3,801,138 A * | 4/1974 | Quick | ............... | B60D 1/06 280/491.1 |
| 3,878,942 A * | 4/1975 | Hansen | ............... | B65D 85/48 211/49.1 |
| 4,112,249 A * | 9/1978 | Carlson | ............... | H02G 5/08 174/68.2 |
| 4,121,276 A * | 10/1978 | Kovatch | ............... | H02B 1/21 361/624 |
| 4,270,019 A * | 5/1981 | Thye | ............... | H01R 11/01 174/32 |
| 4,950,841 A * | 8/1990 | Walker | ............... | H01R 25/162 174/68.2 |
| 5,124,881 A * | 6/1992 | Motoki | ............... | H02B 13/02 361/639 |
| 5,131,547 A * | 7/1992 | Goldberg | ............... | A47F 5/13 108/177 |
| 5,397,209 A * | 3/1995 | Heim | ............... | B23Q 7/001 414/349 |
| 5,821,464 A * | 10/1998 | Graham | ............... | H02G 5/06 174/88 B |
| 6,305,556 B1 | 10/2001 | Mayer | | |
| 6,417,452 B1 | 7/2002 | Doshita | | |
| 6,420,655 B1 * | 7/2002 | Yang | ............... | H02B 1/21 174/70 B |
| 6,603,075 B1 * | 8/2003 | Soares | ............... | H02B 1/21 174/70 B |
| 6,762,362 B1 * | 7/2004 | Cavanaugh | ............... | H05K 7/1457 174/68.2 |
| 6,981,715 B1 * | 1/2006 | Aylett | ............... | B62D 53/0807 280/441 |
| 7,338,109 B1 * | 3/2008 | Crean | ............... | B60P 3/34 296/164 |
| 7,503,266 B2 * | 3/2009 | Carter | ............... | A47B 87/002 108/115 |
| 7,637,220 B2 * | 12/2009 | Fu | ............... | A47B 43/00 108/115 |
| 7,704,083 B1 * | 4/2010 | Cheyne | ............... | H01R 25/162 439/115 |
| 7,806,711 B2 * | 10/2010 | Andersen | ............... | H01R 25/145 439/475 |
| 7,878,842 B2 * | 2/2011 | Jia | ............... | G06F 13/409 439/493 |
| 8,191,717 B2 * | 6/2012 | Mantenuto | ............... | B65D 85/48 211/41.15 |
| 8,191,865 B2 * | 6/2012 | Polins | ............... | B66B 9/16 254/122 |
| 8,453,854 B2 * | 6/2013 | Baran | ............... | A47F 5/10 211/149 |
| 8,523,197 B2 * | 9/2013 | Baatz | ............... | B62B 3/025 280/42 |
| 8,625,256 B2 * | 1/2014 | Schmid | ............... | H02G 5/066 174/70 B |
| 8,717,741 B2 * | 5/2014 | Valenzuela | ............... | H01R 35/04 361/624 |
| 9,033,748 B2 * | 5/2015 | Ramey | ............... | H01R 4/64 439/813 |
| 9,079,597 B2 * | 7/2015 | Gonzalez | ............... | B62B 3/186 |
| 9,592,415 B2 * | 3/2017 | Tseng | ............... | A63B 21/1609 |
| 9,859,630 B2 * | 1/2018 | MacNaughton | ............... | H01R 4/64 |
| 11,172,759 B2 * | 11/2021 | Liu | ............... | A47B 47/028 |
| 2002/0093156 A1 * | 7/2002 | Stevens | ............... | A61G 5/08 280/42 |
| 2002/0139557 A1 * | 10/2002 | Brannmark | ............... | H01R 11/12 174/541 |
| 2003/0040215 A1 * | 2/2003 | Kleen | ............... | H01R 4/70 439/510 |
| 2003/0166353 A1 * | 9/2003 | Bach | ............... | H02B 1/21 439/251 |
| 2007/0270019 A1 * | 11/2007 | Yamaguchi | ............... | H01R 13/6608 439/404 |
| 2008/0038947 A1 * | 2/2008 | Wagener | ............... | H02B 1/21 439/116 |
| 2008/0244052 A1 * | 10/2008 | Bradicich | ............... | H05K 7/1487 361/600 |
| 2010/0051342 A1 * | 3/2010 | Diaz | ............... | H02B 1/56 174/68.2 |
| 2010/0221941 A1 * | 9/2010 | Andersen | ............... | H01R 13/112 29/747 |
| 2013/0170929 A1 * | 7/2013 | Wiechers | ............... | H02G 5/04 414/222.01 |
| 2013/0279082 A1 * | 10/2013 | Valenzuela | ............... | H02B 13/005 361/637 |
| 2014/0244886 A1 * | 8/2014 | Meert | ............... | G06F 13/4027 710/306 |
| 2015/0181748 A1 * | 6/2015 | Bailey | ............... | G11B 33/128 361/679.02 |
| 2016/0197463 A1 * | 7/2016 | Alefelder | ............... | H02G 5/007 174/72 B |
| 2018/0076585 A1 * | 3/2018 | Harris, III | ............... | H01R 13/17 |
| 2018/0097322 A1 | 4/2018 | Harris, III | | |
| 2018/0212379 A1 * | 7/2018 | Reed | ............... | H01R 25/145 |
| 2019/0148897 A1 * | 5/2019 | Rode | ............... | H02G 5/007 439/213 |
| 2019/0214797 A1 * | 7/2019 | Zhang | ............... | H02B 1/20 |
| 2020/0176901 A1 * | 6/2020 | Mosher | ............... | H01R 41/00 |

FOREIGN PATENT DOCUMENTS

| | | | | |
|---|---|---|---|---|
| CN | 201260284 Y | | 6/2009 | |
| CN | 102326305 A * | | 1/2012 | ............ H01R 13/112 |
| CN | 102511113 A * | | 6/2012 | ............ H01R 13/20 |
| CN | 203951042 U | | 11/2014 | |
| CN | 204516613 U | | 7/2015 | |
| CN | 204792361 U | | 11/2015 | |
| CN | 204835417 U | | 12/2015 | |
| CN | 105742840 A * | | 7/2016 | ............ B60M 1/305 |
| CN | 105765806 A * | | 7/2016 | ............ H01H 3/32 |
| CN | 108336510 A | | 7/2018 | |
| CN | 108437819 A * | | 8/2018 | |
| CN | 108493652 A * | | 9/2018 | |
| CN | 109510015 A * | | 3/2019 | ......... H01R 12/7088 |
| CN | 110600939 A * | | 12/2019 | ............ H01H 9/085 |
| CN | 112567576 A * | | 3/2021 | ............ H01R 11/01 |
| DE | 20113044 U1 * | | 11/2001 | ............ H01R 25/145 |
| DE | 69833363 T2 | | 8/2006 | ............ H02G 5/007 |
| DE | 102017100039 A1 * | | 7/2017 | ............ H01R 13/46 |
| DE | 102017100140 A1 * | | 7/2017 | ............ H01R 25/162 |
| DE | 102017100141 A1 * | | 7/2017 | ............ H01R 25/00 |
| DE | 102017100142 A1 * | | 7/2017 | ............ H01R 25/145 |
| DE | 102017100143 A1 * | | 7/2017 | ............ H01R 25/162 |
| DE | 102017217688 A1 * | | 4/2019 | |
| EP | 1065768 A2 * | | 1/2001 | ............ H01R 9/226 |
| EP | 2531011 A2 * | | 12/2012 | ............ H05K 7/1492 |
| EP | 2833490 A1 * | | 2/2015 | ............ A47F 11/00 |
| EP | 2793332 B1 | | 8/2015 | |
| EP | 3104466 A1 * | | 12/2016 | ............ H01R 13/113 |
| FR | 2809236 A1 | | 11/2001 | |

(56) References Cited

FOREIGN PATENT DOCUMENTS

| JP | S617879 | U | | 1/1986 | |
|---|---|---|---|---|---|
| JP | 10660240 | U | | 8/1994 | |
| JP | 2000201419 | A | | 7/2000 | |
| JP | 2015090856 | A | * | 5/2015 | ............ H05K 7/1492 |
| JP | 2015153503 | A | * | 8/2015 | ............ H01R 12/51 |
| JP | 2016062580 | A | | 4/2016 | |
| JP | 2018026523 | A | | 2/2018 | |
| JP | 3220684 | U | * | 3/2019 | |
| KR | 200366469 | Y1 | * | 11/2004 | |
| KR | 20060115223 | A | * | 11/2006 | |
| KR | 20070002427 | A | * | 1/2007 | |
| KR | 20070058452 | A | * | 8/2007 | |
| KR | 100757776 | B1 | * | 9/2007 | |
| KR | 100759524 | B1 | * | 9/2007 | |
| KR | 100820911 | B1 | * | 4/2008 | |
| KR | 101085990 | B1 | * | 11/2011 | |
| KR | 101209892 | B1 | * | 12/2012 | |
| KR | 20150119856 | A | * | 10/2015 | |
| KR | 101625153 | B1 | * | 5/2016 | |
| KR | 20160063624 | A | | 6/2016 | |
| KR | 101726367 | B1 | * | 4/2017 | |
| KR | 101909248 | B1 | * | 10/2018 | |
| KR | 20190129234 | A | * | 11/2019 | |
| KR | 20200083192 | A | * | 7/2020 | |
| KR | 102175332 | B1 | * | 11/2020 | |
| KR | 20210025129 | A | * | 3/2021 | |
| WO | WO-02089279 | A1 | * | 11/2002 | ............... H02B 1/21 |
| WO | WO-2004110221 | A1 | * | 12/2004 | ............ A47B 3/002 |
| WO | WO-2006101265 | A1 | * | 9/2006 | ............ B65D 19/44 |
| WO | WO-2015036303 | A1 | * | 3/2015 | ............ H02G 5/007 |
| WO | 2017106016 | A1 | | 6/2017 | |
| WO | 2018093981 | A1 | | 5/2018 | |

OTHER PUBLICATIONS

International Search Report and Written Opinion received for PCT Application No. PCT/US2019/048218, dated Dec. 16, 2019, 9 Pages.

Office action received for JP Patent application No. 2021-500454, datedn Feb. 8, 2022, 4 pages (2 pages of English translation and 2 pages of Official copy).

Office Action received for CN Application No. 201980053767.1, dated Dec. 1, 2021, 21 Pages (11 Pages of English translation and 10 Pages of Official notification).

* cited by examiner

HINGED BUSBAR ASSEMBLY

RELATED CASES

This application is a National Phase of International Application No. PCT/US2019/048218, filed on Aug. 27, 2019, which claims the domestic benefit of U.S. Provisional Patent Application No. 62/723,335 filed Aug. 27, 2018, the contents of which are incorporated herein in their entireties.

FIELD OF THE DISCLOSURE

The present disclosure relates to field of busbars and, in particular to, to hinged busbar assemblies.

DESCRIPTION OF RELATED ART

A sliding insertable/extractable unit within rack mounted hardware may require it to be powered on when either partially or fully extended. Typically, this would be in a storage enclosure where the chassis (or portion thereof) slides out giving access to the storage devices which are still powered on and functional at this time. Maintaining power to this unit when fully extended requires cabling and standard interconnect assemblies that would normally be used in a sliding track system. Such an assembly can be cumbersome due to large American wire gauge (AWG) wires, limiting ease of insertion/extraction, and due to physical size. Such an assembly also limits cooling airflow (in both open and closed states). Thus, certain individuals would appreciate an improvement to the assemblies which maintain power to such units.

BRIEF SUMMARY

Transitioning the power delivery to a busbar, instead of cabling assembly, for a sliding insertable/extractable unit within rack mounted hardware allows for a smaller footprint that improves airflow/cooling. The disclosure herein provides busbar elements of variable length and "links" busbar elements together using high current machined pins and known electrical sockets at pivotal connections. Each pivotal connection functions like a door hinge, but in addition to being a point of mechanical connection/pivot point, also carries the current through the busbar assembly. Each end of the busbar assembly is connected to a midplane, backplane, a daughter card and a chassis that needs to be insertable/retractable.

In an embodiment, a hinged busbar assembly includes a first mounting busbar configured to be electrically and mechanically connected to a first component at a fixed connection, a second mounting busbar configured to be electrically and mechanically connected to a second component at a fixed connection, and at least two extension busbars extending between the first and second mounting busbars, wherein adjacent extension busbars are electrically and mechanically connected to each other at a pivotal connection.

In an embodiment, an assembly is provided. The assembly includes a first component, a second component and a hinged busbar assembly. The hinged busbar assembly includes a first mounting busbar electrically and mechanically connected to the first component at a first fixed connection, a second mounting busbar electrically and mechanically connected to the second component at a second fixed connection, and at least two extension busbars extending between the first and second mounting busbars. Adjacent extension busbars are electrically and mechanically connected to each other at a first pivotal connection. One of the at least two extension busbars is electrically and mechanically connected to the first mounting busbar at a second pivotal connection. Another one of the at least two extension busbars is electrically and mechanically connected to the second mounting busbar at a third pivotal connection

BRIEF DESCRIPTION OF THE DRAWINGS

The present disclosure is illustrated by way of example, and not limited, in the accompanying figures in which like reference numerals indicate similar elements and in which.

DETAILED DESCRIPTION

As required, the appended figures illustrate embodiments of the present disclosure and it is to be understood that the disclosed embodiments are merely exemplary of the disclosure, which may be embodied in various forms. Therefore, specific details disclosed herein are not to be interpreted as limiting, but merely as a basis for the claims and as a representative basis for teaching one skilled in the art to variously employ the present disclosure.

The drawings illustrate embodiments of the present disclosure and it is to be understood that the disclosed embodiments are merely exemplary of the disclosure, which may be embodied in various forms. Therefore, specific details disclosed herein are not to be interpreted as limiting, but merely as a basis for the claims and as a representative basis for teaching one skilled in the art to variously employ the present disclosure.

Figure 1:
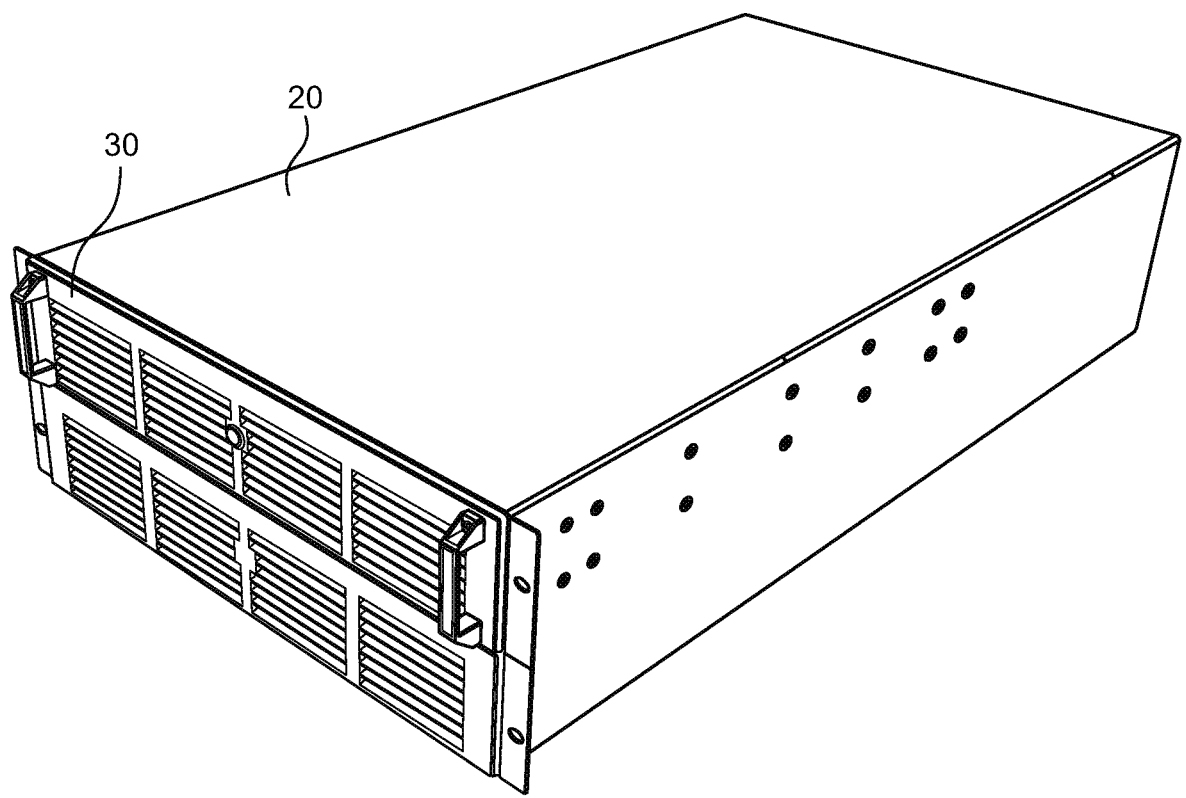
FIG. 1 depicts a prior art rack mounted hardware having a sliding insertable/extractable unit therein.
Figure 2:
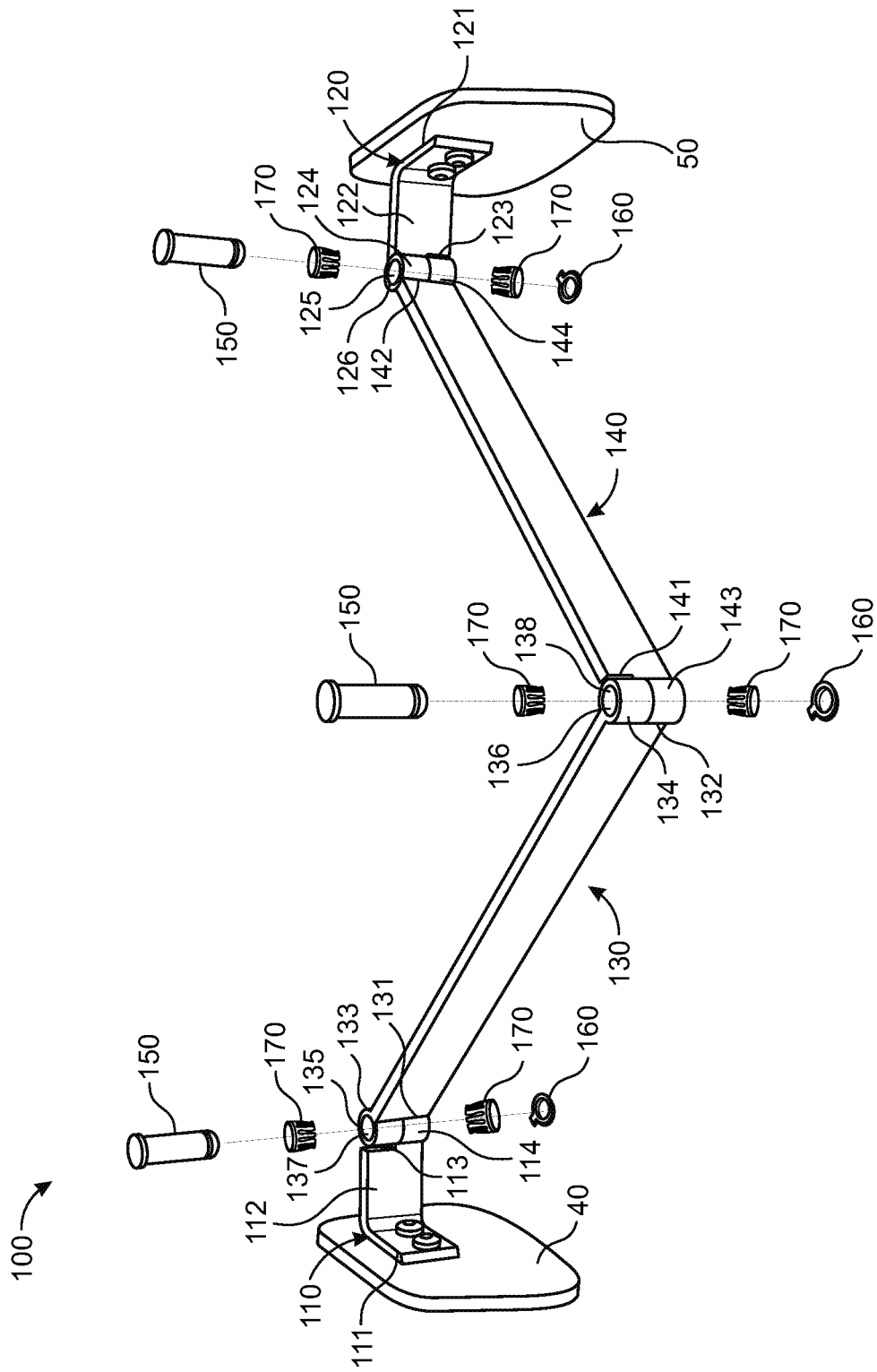
FIG. 2 depicts an exploded perspective view of a hinged busbar assembly which incorporates features of a first embodiment of the present disclosure mounted to a first component provided on the sliding insertable/extractable unit and mounted to a second component provided on the rack mounted hardware.

FIG. 1 illustrates rack mounted hardware 20 having a sliding insertable/extractable unit 30 therein. More specifically, FIGS. 1 and 2 illustrate that the rack mounted hardware 20 is a 4 U rack system with an insertable/extractable upper 2 U portion. As shown, the sliding insertable/extractable unit 30 may take the form of a drawer and the rack mounted hardware 20 may take the form of a cabinet in which the drawer is mounted. The sliding insertable/extractable unit 30 has a first component 40, e.g., a midplane, a backplane, a daughter card etc., and a chassis, mounted thereon, and the rack mounted hardware 20 has a second component 50, e.g., a midplane, a backplane, a daughter card, etc. and a chassis, mounted thereon.

The remaining drawings illustrate various embodiments of a hinged busbar assembly 100, 200, 300, 400, 500, 600, 700, 800 which may be utilized in connection with connecting the first and second components 40, 50 together such that power is transmitted between the components 40, 50 and that ground is provided between the components 40, 50. The hinged busbar assembly 100, 200, 300, 400, 500, 600, 700, 800 allows the sliding insertable/extractable unit 30 to be pulled outward from the rack mounted hardware 20 or to be pushed inward into the rack mounted hardware 20 while always maintaining an electrical path between the sliding insertable/extractable unit 30 and the rack mounted hardware 20.

Each embodiment of the hinged busbar assembly 100, 200, 300, 400, 500, 600, 700, 800 has a first mounting busbar 110, 610 configured to be mechanically and electrically mounted to the first component 40, a second mounting busbar 120, 620 configured to be mechanically and electrically mounted to the second component 50, a first extension busbar 130, 630 configured to be mechanically and electrically connected to the first mounting busbar 110, 610 at a first pivotal connection 180, a second extension busbar 140, 640 configured to be mechanically and electrically connected to the second mounting busbar 120, 620 at a second pivotal connection 182 and configured to be mechanically and electrically connected to the first extension busbar 130, 630 at a third pivotal connection 184.

Attention is directed to a first embodiment of the hinged busbar assembly 100 as illustrated in FIGS. 2-7. The hinged busbar assembly 100 includes first and second mounting busbars 110, 120, first and second extension busbars 130, 140, three pins 150, three retention clips 160, and six electrical contacts 170. Each electrical contact 170 may be a spring contact. Each component of the hinged busbar assembly 100, namely, the mounting busbars 110, 120, the extension busbars 130, 140, the pins 150, the retention clips 160 and the electrical contacts 170, are conductive so that power can be transmitted along the hinged busbar assembly 100 between the components 40, 50 and so that the hinged busbar assembly 100 can be used as a ground return between the components 40, 50.

The mounting busbars 110, 120 may take a variety of forms.

In a first embodiment, the first mounting busbar 110 is generally L-shaped in configuration and has a first leg 111 which is secured by appropriate means, e.g., bolt, screw, rivet, etc. to the first component 40 at a fixed connection, and a second leg 112 which extends generally perpendicular to the first leg 111 and to the first component 40. The second leg 112 has a free end 113. A generally cylindrical extension 114 extends outwardly from an upper or lower portion of the free end 113 (in FIG. 2, the first mounting busbar 110 shows the generally cylindrical extension 114 extending outwardly from the lower portion of the free end 113). The generally cylindrical extension 114 has an aperture (not shown) provided therethrough which defines an internal wall (not shown) of the generally cylindrical extension 114. The second mounting busbar 120 is identical to the first mounting busbar 110 such that the same part can be used for either the first mounting busbar 110 or the second mounting busbar 120. Thus, the second mounting busbar 120 has a first leg 121 which is secured by appropriate means, e.g., bolt, screw, rivet, etc. to the second component 50 at a fixed connection, and a second leg 122 which extends generally perpendicular to the first leg 121 and to the second component 50. The second leg 122 has a free end 123. A generally cylindrical extension 124 extends outwardly from an upper or lower portion of the free end 123 (in FIG. 2, the second mounting busbar 120 shows the generally cylindrical extension 124 extending outwardly from the upper portion of the free end 123). The generally cylindrical extension 124 has an aperture 125 provided therethrough which defines an internal wall 126 of the generally cylindrical extension 124. The first leg 111, 121 of the mounting busbar 110, 120 can be modified to connect the mounting busbar 110, 120 to a first component 40, 50 that is mounted horizontally (such that the mounting busbar 110 is not generally L-shaped).

Figure 4:
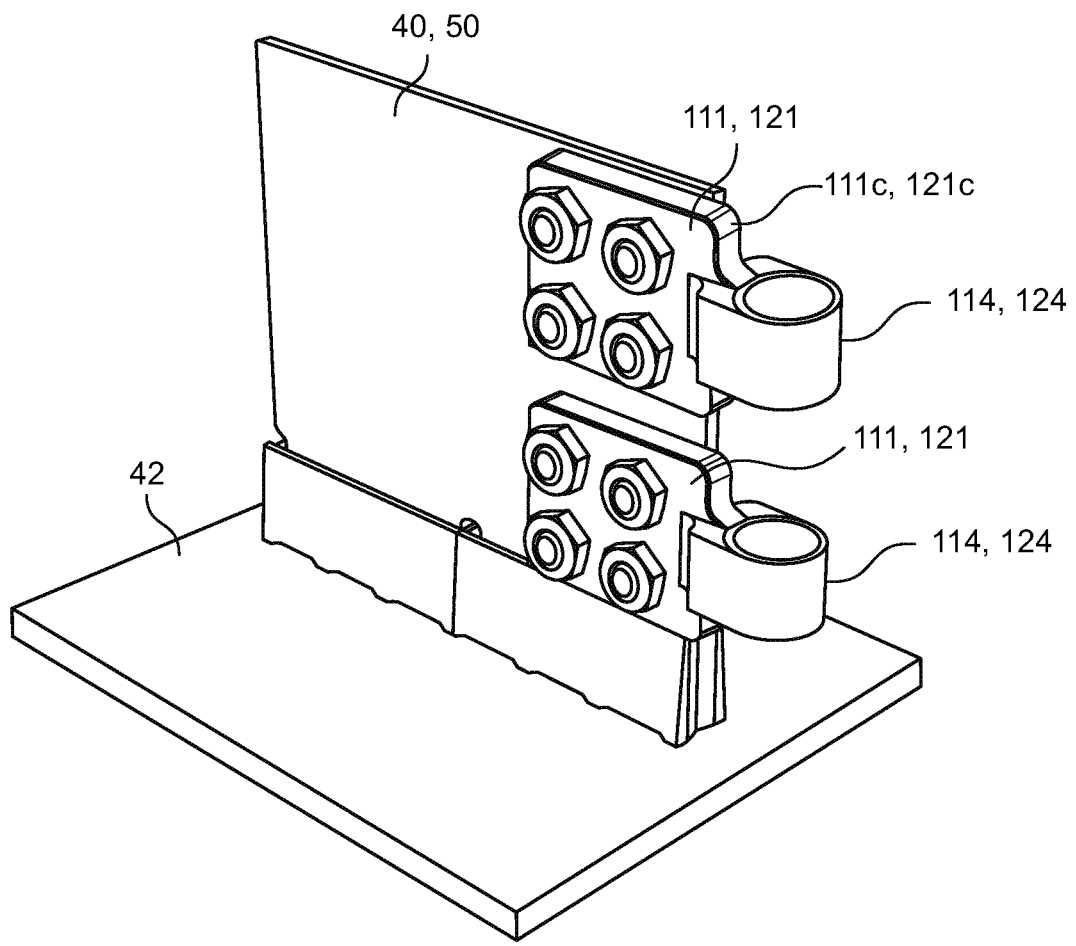
FIG. 4 depicts a perspective view of an embodiment of a pair of mounting busbars mounted of one of the components; the components in turn being mounted on a printed circuit board.
Figure 5:
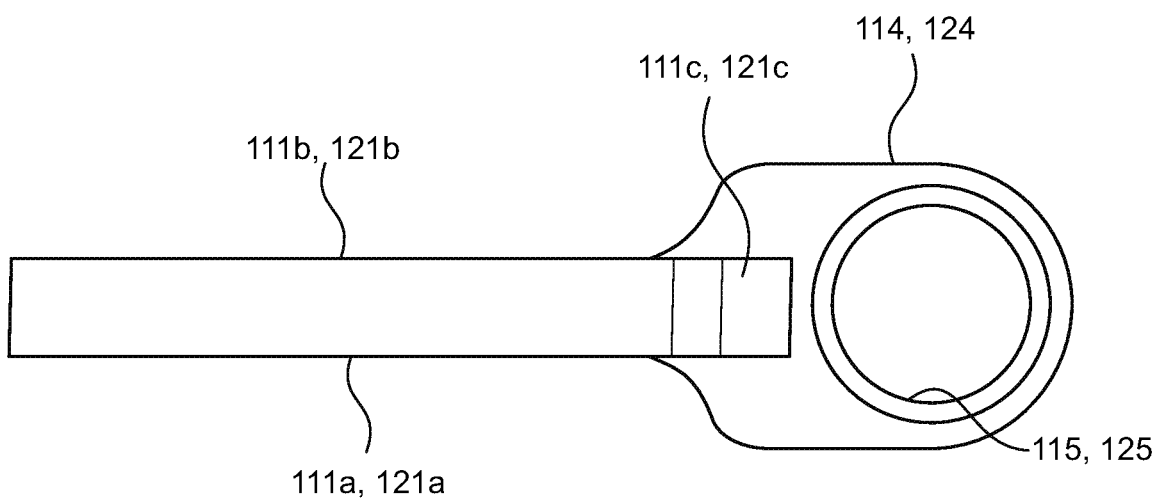
FIG. 5 depicts a top plan view of one of the mounting busbars of FIG. 4.

In a second embodiment as shown in FIGS. 4 and 5, the first and/or second mounting busbar 110, 120 only has the first leg 111, 121 which is secured by appropriate means, e.g., bolt, screw, rivet, etc. to the respective component 40, 50 at the fixed connections. The first leg 111, 121 is formed as a plate. The first leg 111, 121 has a first planar side surface 111a, 121a and a second planar side surface 111b, 121b. One of the sides, for example side 111b, 121b, is abutted against the respective component 40, 50 such that the first leg 111, 121 and the component 40, 50 are parallel to each other. A generally cylindrical extension 114, 124 extends outwardly from an edge 111c, 121c of the first leg 111, 121 and outward from the respective component 40, 50. The generally cylindrical extension 114, 124 has an aperture 115, 125 provided therethrough which defines an internal wall of the generally cylindrical extension 114, 124. In this embodiment, the component 40, 50 may be a printed circuit board which is inserted into an edge card connector on another printed circuit board 42. While a single extension 114, 124 is shown, multiple extensions 114, 124 may be provided.

Figure 6:
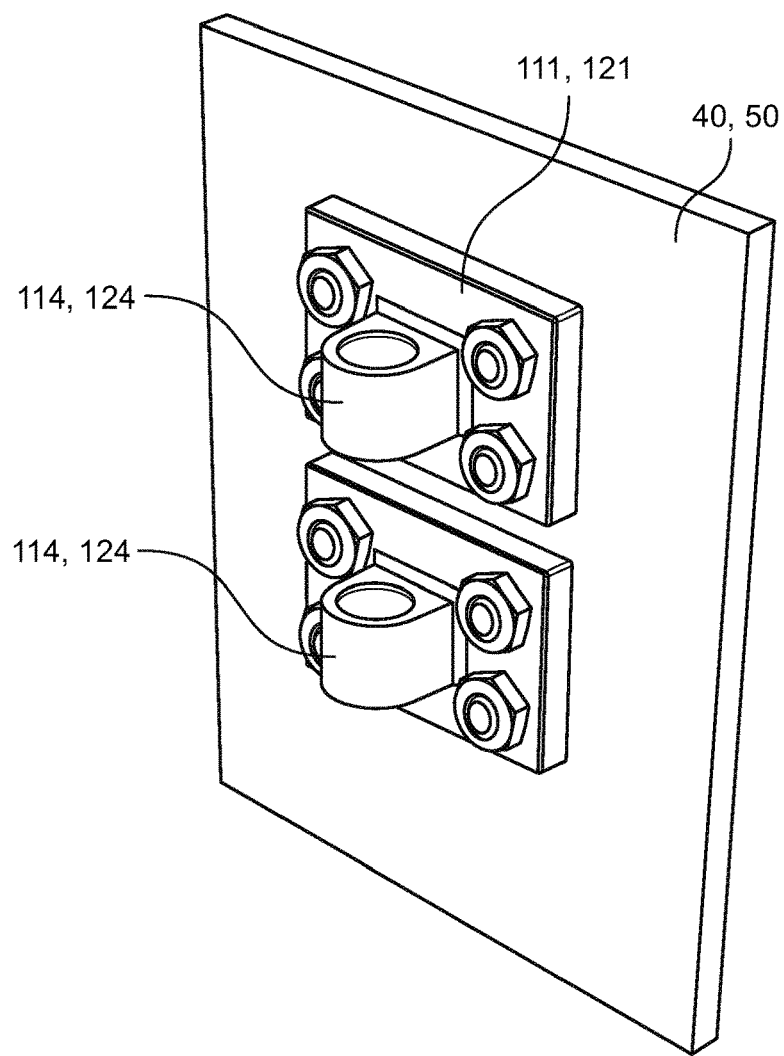
FIG. 6 depicts a perspective view of another embodiment of a pair of mounting busbars mounted of one of the components.
Figure 7:
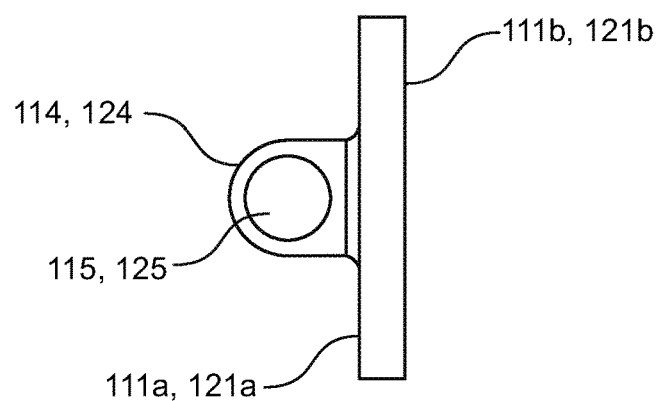
FIG. 7 depicts a top plan view of one of the mounting busbars of FIG. 6.

In a third embodiment as shown in FIGS. 6 and 7, the first and/or second mounting busbar 110, 120 only has the first leg 111, 121 which is secured by appropriate means, e.g., bolt, screw, rivet, etc. to the respective component 40, 50 at the fixed connections. The first leg 111, 121 is formed as a plate. The first leg 111, 121 has a first planar side surface 111a, 121a and a second planar side surface 111b, 121b. One of the sides, for example side 111b, 121b is abutted against the respective component 40, 50 such that the first leg 111, 121 and the component 40, 50 are parallel to each other. A generally cylindrical extension 114, 124 extends outwardly from a middle of the first leg 111, 121 and outward from the respective component 40, 50 which may be a midplane or a backplane. The generally cylindrical extension 114, 124 has an aperture 115, 125 provided therethrough which defines an internal wall of the generally cylindrical extension 114, 124. In this embodiment, the component 40, 50 may be an edge card which is inserted into a printed circuit board 42. While a single extension 114, 124 is shown, multiple extensions 114, 124 may be provided.

The first extension busbar 130 is preferably straight in configuration and has a first free end 131 and a second, opposite free end 132. The sides of the first extension busbar 130 between the ends 131, 132 may be planar. A generally cylindrical extension 133 extends outwardly from an upper or lower portion of the first free end 131 and a generally cylindrical extension 134 extends outwardly from an upper or lower portion of the second free end 132 (in FIG. 2, the generally cylindrical extensions 133, 134 are shown as extending outwardly from the upper portion of the free ends 131, 132). The generally cylindrical extensions 133, 134 each have an aperture 135, 136 provided therethrough, respectively, which defines an internal wall 137, 138 of the generally cylindrical extensions 133, 134. The generally cylindrical extension 133 is positioned relative to the generally cylindrical extension 114 of the first mounting busbar 110 such that the apertures thereof are in alignment with one another. As illustrated in FIG. 2, the generally cylindrical extension 133 is positioned above the generally cylindrical extension 114.

The second extension busbar 140 is identical to the first extension busbar 130 such that the same part can be used for either the first extension busbar 130 or the second extension busbar 140. Thus, the second extension busbar 140 has a first free end 141 and a second, opposite free end 142. The sides of the second extension busbar 140 between the ends 141, 142 may be planar. A generally cylindrical extension 143 extends outwardly from an upper or lower portion of the first free end 141 and a generally cylindrical extension 144 extends outwardly from an upper or lower portion of the second free end 142 (in FIG. 2, the generally cylindrical extensions 143, 144 are shown as extending outwardly from the lower portion of the free ends 141, 142). The generally cylindrical extensions 143, 144 each have an aperture (not shown) provided therethrough, respectively, which defines an internal wall (not shown) of the generally cylindrical extensions 143, 144. The generally cylindrical extension 143 is positioned relative to the generally cylindrical extension 134 of the first extension busbar 130 such that the apertures thereof are in alignment with one another. As illustrated in FIG. 2, the generally cylindrical extension 143 is positioned below the generally cylindrical extension 134. The generally cylindrical extension 144 is positioned relative to the generally cylindrical extension 124 of the second mounting busbar 120 such that the apertures thereof are in alignment with one another. As illustrated in FIG. 2, the generally cylindrical extension 144 is positioned below the generally cylindrical extension 124.

Each cylindrical extension 114, 124, 133, 134, 143, 144 has one of the electrical contacts 170 secured within the respective aperture to the respective inner wall. The electrical contacts 170 may have any suitable configuration, but are preferably of the type shown and described in International Publication No. WO 2018/093981 owned by Applicant, the content of which is incorporated herein by reference in its entirety.

The first connection 180 is formed by inserting one of the pins 150 through the aligned apertures and electrical contacts 170 of the cylindrical extensions 114, 133 of the first mounting busbar 110 and the first extension busbar 130, respectively, and being secured in place by one of the retention clips 160, thus both mechanically and electrically connecting the first mounting busbar 110 and the first extension busbar 130. The second connection 182 is formed by inserting a second one of the pins 150 through the aligned apertures and electrical contacts 170 of the cylindrical extensions 124, 144 of the second mounting busbar 120 and the second extension busbar 140, respectively, and being secured in place by a second one of the retention clips 160, thus both mechanically and electrically connecting the second mounting busbar 120 and the second extension busbar 140. The third connection 184 is formed by inserting a third one of the pins 150 through the aligned apertures and electrical contacts 170 of the cylindrical extensions 134, 143 of the first and second extension busbars 130, 140, respectively, and being secured in place by a third one of the retention clips 160, thus both mechanically and electrically connecting the first and second extension busbars 130, 140. The first, second and third connections 180, 182, 184 thus act like hinges such that the first and second extension busbars 130, 140 can rotate about same, all while keeping an electrical connection.

Figure 3:
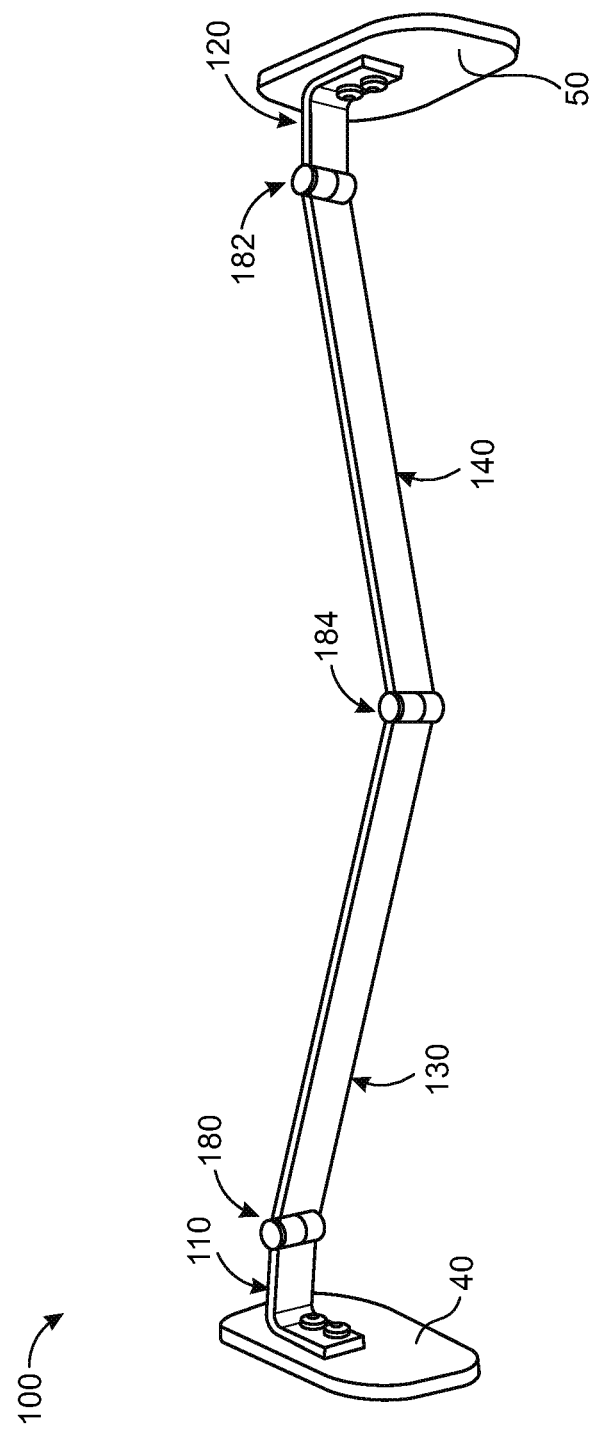
FIG. 3 depicts an assembled perspective view of the hinged busbar assembly of FIG. 2 mounted to the first component provided on the sliding insertable/extractable unit and mounted to the second component provided on the rack mounted hardware.
Figure 8:
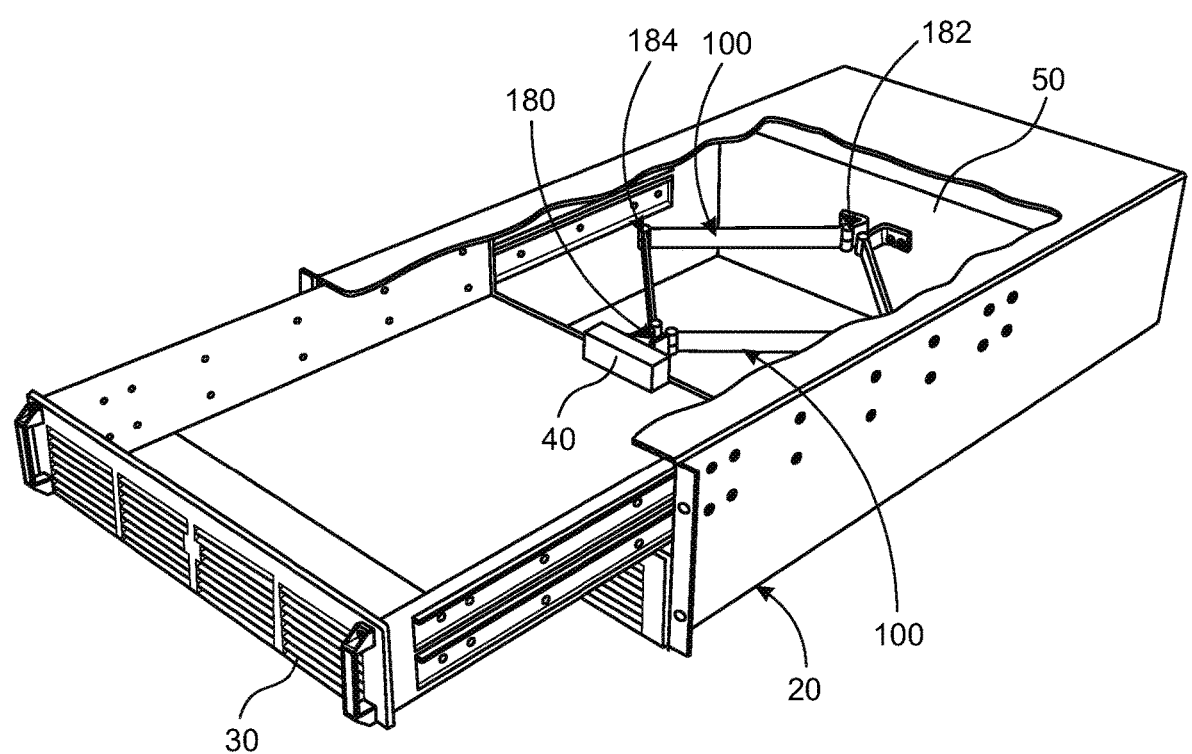
FIG. 8 depicts a perspective view of the hinged busbar assembly of FIG. 2 mounted to the first component provided on the sliding insertable/extractable unit and mounted to the second component provided on the rack mounted hardware, with the sliding insertable/extractable unit partially withdrawn from the rack mounted hardware.
Figure 9:
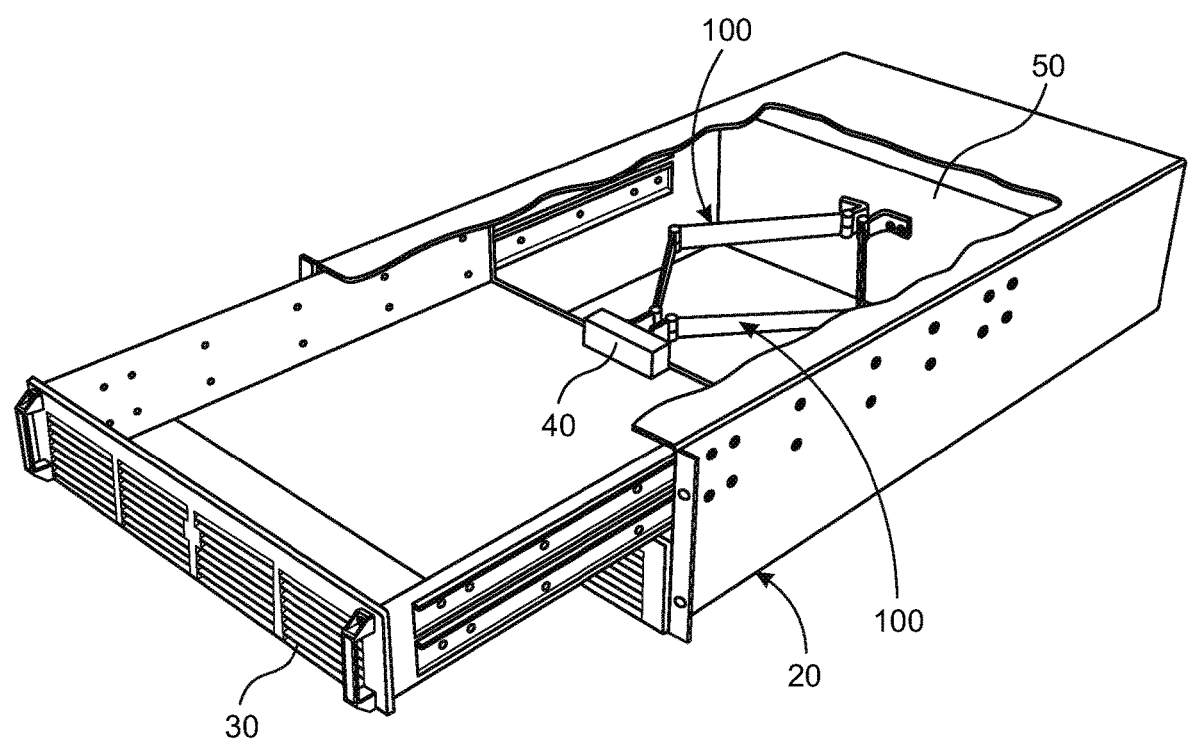
FIG. 9 depicts a perspective view of the hinged busbar assembly of FIG. 2 mounted to the first component provided on the sliding insertable/extractable unit and mounted to the second component provided on the rack mounted hardware, with the sliding insertable/extractable unit even further partially withdrawn from the rack mounted hardware.
Figure 10:
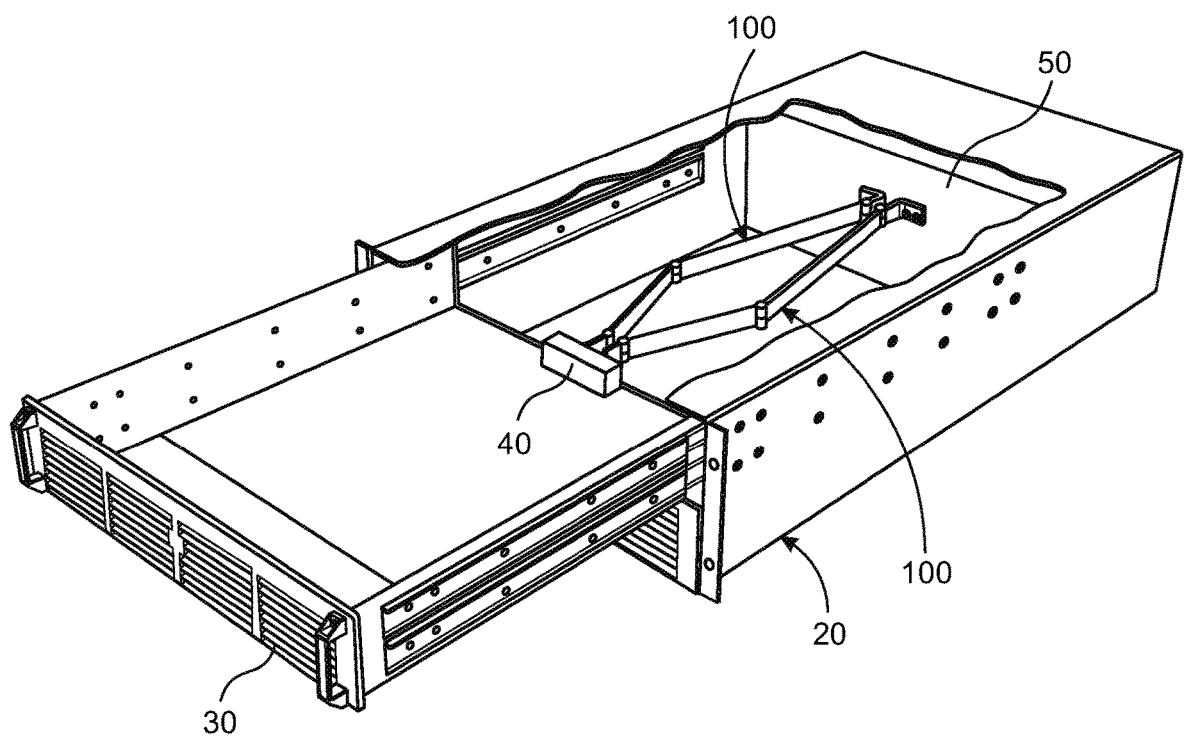
FIG. 10 depicts a perspective view of the hinged busbar assembly of FIG. 2 mounted to the first component provided on the sliding insertable/extractable unit and mounted to the second component provided on the rack mounted hardware, with the sliding insertable/extractable unit fully withdrawn from the rack mounted hardware.

FIGS. 8-10 illustrate a pair of hinged busbar assemblies 100 positioned adjacent to one another within the rack mounted hardware 20 such that the sliding insertable/extractable unit 30 is movable therein, yet still powered when fully extended. The first component 40 is mounted on the sliding insertable/extractable unit 30 and the second component 50 is mounted on the rack mounted hardware 20. One of the hinged busbar assemblies 100 is positioned as illustrated in FIGS. 3 and 4, while the other one of the hinged busbar assemblies 100 is in a flipped 180 degrees configuration, such that rotation of the first and second extension busbars 130, 140 occurs in an opposite direction. The hinged busbar assemblies 100 pivot around the connections 180, 182, 184. As shown in FIGS. 8-10, the hinged busbar assemblies 100 pivot in a scissor-like fashion as a result of the orientation that the hinged busbar assemblies 100 are mounted between the sliding insertable/extractable unit 30 and the rack mounted hardware 20. In an embodiment, one hinged busbar assembly 100 transmits power, such as 12 Volt DC, between the first and second components 40, 50, and the other hinged busbar assembly 100 is used for the ground return between the first and second components 40, 50.

Figure 11:
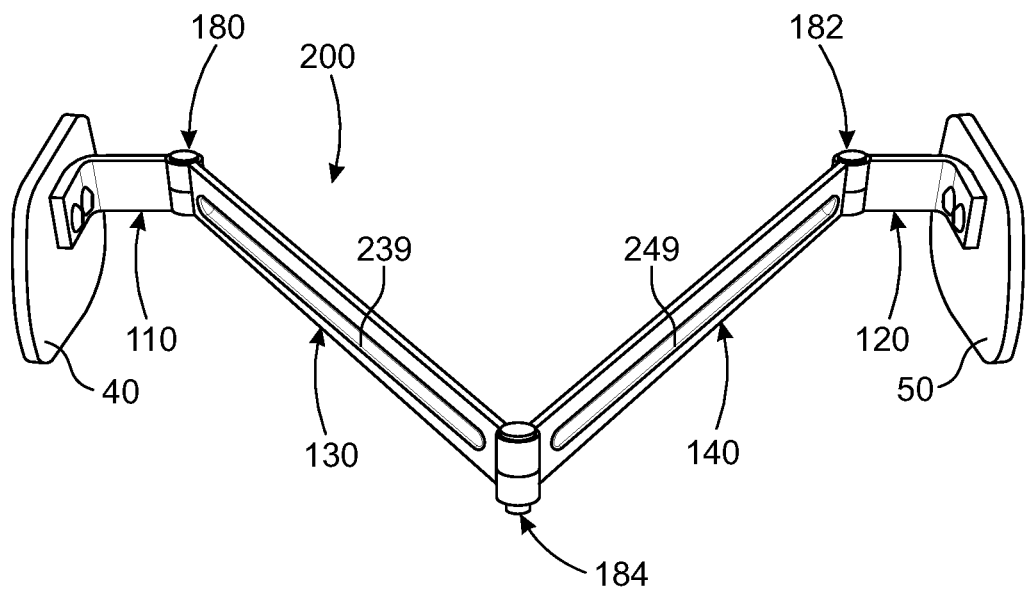
FIG. 11 depicts a perspective view of a hinged busbar assembly which incorporates features of a second embodiment of the present disclosure mounted to a first component provided on the sliding insertable/extractable unit and mounted to a second component provided on the rack mounted hardware.

FIG. 11 illustrates a second embodiment of the hinged busbar assembly 200. The hinged busbar assembly 200 is identical to the hinged busbar assembly 100 except that the first and second extension busbars 130, 140 include embossments 239, 249, respectively, which are added to the sides of the extension busbars 130, 140 along the length thereof in order to improve the rigidity of the extension busbars 130, 140. In the embodiment as shown, each embossment 239, 249 is linear and extends from proximate to the first end 131, 141 to proximate to the respective second end 132, 142. The embossments 239, 249 may take a variety of shapes, for example, but not limited to, a curve, a wave shape, a zigzag, and the like, and do not need to have the same shape. In addition, the embossments 239, 249 may be formed from a plurality of embossments that overlap along the length of the extension busbars 130, 140. For example, an upper embossment extends from proximate to the first end 131, 141 to just pass a midpoint of the extension busbars 130, 140, and a lower embossment extends from proximate to the second end 132, 142 to just pass the midpoint of the extension busbars 130, 140.

Figure 12:
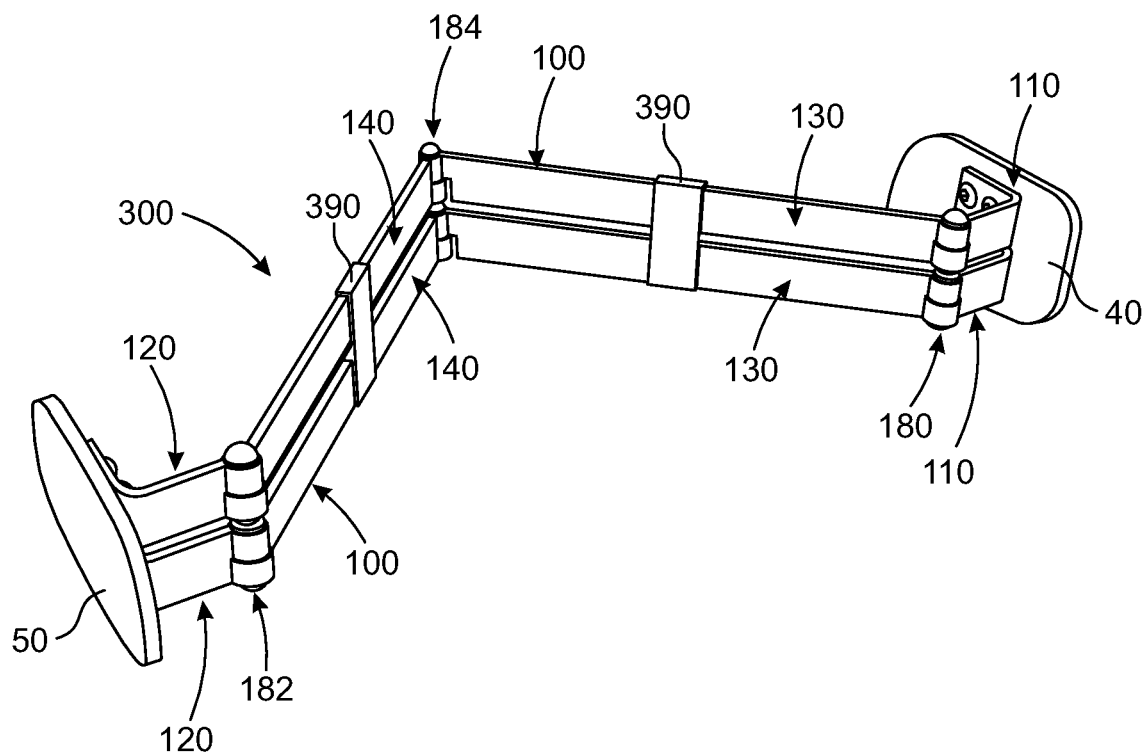
FIG. 12 depicts a perspective view of a hinged busbar assembly which incorporates features of a third embodiment of the present disclosure mounted to a first component provided on the sliding insertable/extractable unit and mounted to a second component provided on the rack mounted hardware.

FIG. 12 illustrates a third embodiment of the hinged busbar assembly 300. The hinged busbar assembly 300 includes a pair of identical hinged busbar assemblies 100 positioned adjacent to one another, e.g., one directly on top of the other. While shown as top and bottom busbar assemblies 100, the busbar assemblies 100 could be side-by-side. Each hinged busbar assembly 100 is connected at its first end to the first component 40 and connected at its second end to the second component 50. The hinged busbar assemblies 100 are spaced apart from each such that a space is formed therebetween along the lengths of the hinged busbar assemblies 100. Each hinged busbar assembly 100 provides its own electrical path between the first and second components 40, 50. The hinged busbar assembly 300 further includes a pair of insulative securement devices 390 which secure the hinged busbar assemblies 100 in position together, thereby ensuring that the hinged busbar assemblies 100 rotate together. The first securement device 390 generally surrounds both of the first extension busbars 130 to secure them in position together, and the second securement device 390 generally surrounds both of the second extension busbars 140 to secure them in position together, thereby ensuring that each of the hinged busbar assemblies 100 will rotate together. The securement devices 390 may be straps, bands and the like. Each securement device 390 may be generally O-shaped and positioned around the respective extension busbars 130, 140.

Figure 13:
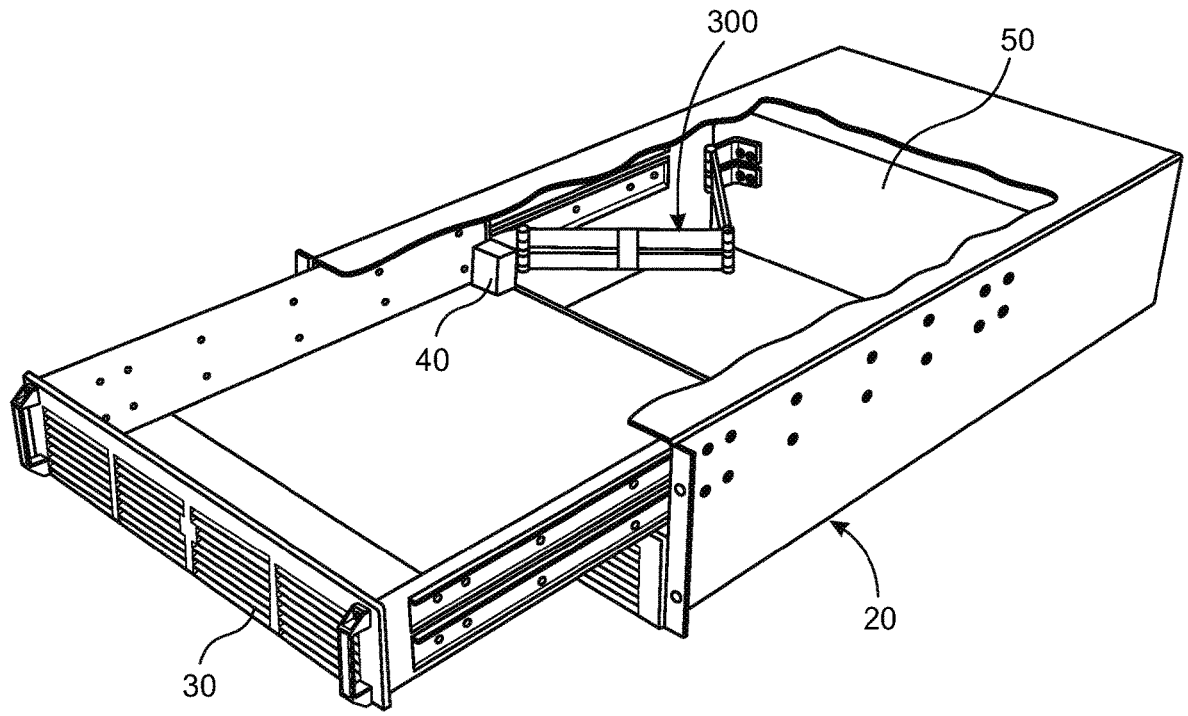
FIG. 13 depicts a perspective view of the hinged busbar assembly of FIG. 12 mounted to the first component provided on the sliding insertable/extractable unit and mounted to the second component provided on the rack mounted hardware, with the sliding insertable/extractable unit partially withdrawn from the rack mounted hardware.

FIG. 13 illustrates the hinged busbar assembly 300 being positioned within the rack mounted hardware 20 such that the sliding insertable/extractable unit 30 is movable therein, yet still powered when fully extended. The first component 40 is mounted on the sliding insertable/extractable unit 30 and the second component 50 is mounted on the rack mounted hardware 20. While only one hinged busbar assembly 300 is illustrated in FIG. 10, it is to be understood that further hinged busbar assemblies 300 may be utilized as desired/required. In an embodiment, one hinged busbar assembly 100 of the hinged busbar assembly 300 transmits power, such as 12 Volt DC, between the first and second components 40, 50, and the other hinged busbar assembly 100 the hinged busbar assembly 300 is used for the ground return between the first and second components 40, 50.

Figure 14:
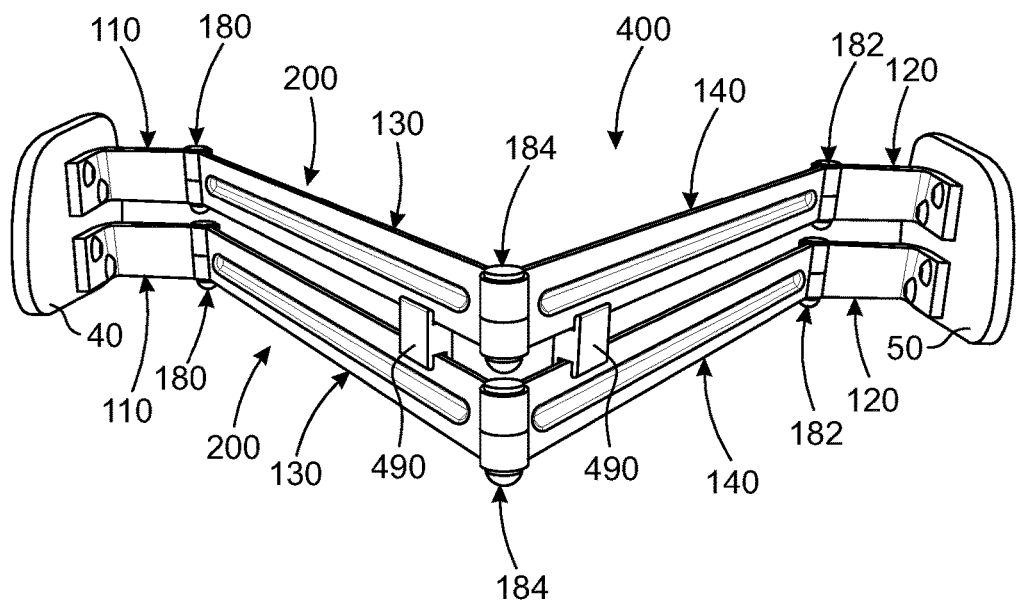
FIG. 14 depicts a perspective view of a hinged busbar assembly which incorporates features of a fourth embodiment of the present disclosure mounted to a first component provided on the sliding insertable/extractable unit and mounted to a second component provided on the rack mounted hardware.

FIG. 14 illustrates a fourth embodiment of the hinged busbar assembly 400. The hinged busbar assembly 400 includes a pair of identical hinged busbar assemblies 200 positioned adjacent to one another, e.g., one directly on top of the other. While shown as top and bottom busbar assemblies 100, the busbar assemblies 100 could be side-by-side. Each hinged busbar assembly 200 is connected at its first end to the first component 40 and connected at its second end to the second component 50. The hinged busbar assemblies 200 are spaced apart from each such that a space is formed therebetween along the lengths of the hinged busbar assemblies 200. Each hinged busbar assembly 200 provides its own electrical path between the first and second components 40, 50. The hinged busbar assembly 400 then further includes a pair of insulative securement devices 490 which secure the hinged busbar assemblies 200 in position together, thereby ensuring that the hinged busbar assemblies 200 rotate together. The first securement device 490 is generally H-shaped and is positioned within the space between both of the first extension busbars 130 to secure them in position together, and the second securement device 490 is generally H-shaped and is positioned within the space between both of the second extension busbars 140 to secure them in position together, thereby ensuring that each of the hinged busbar assemblies 200 will rotate together. The securement device 390 of FIG. 9 can be used in this fourth embodiment in place of the securement device 490; the securement device 490 of FIG. 11 can be used in the third embodiment in place of the securement device 390.

Figure 15:
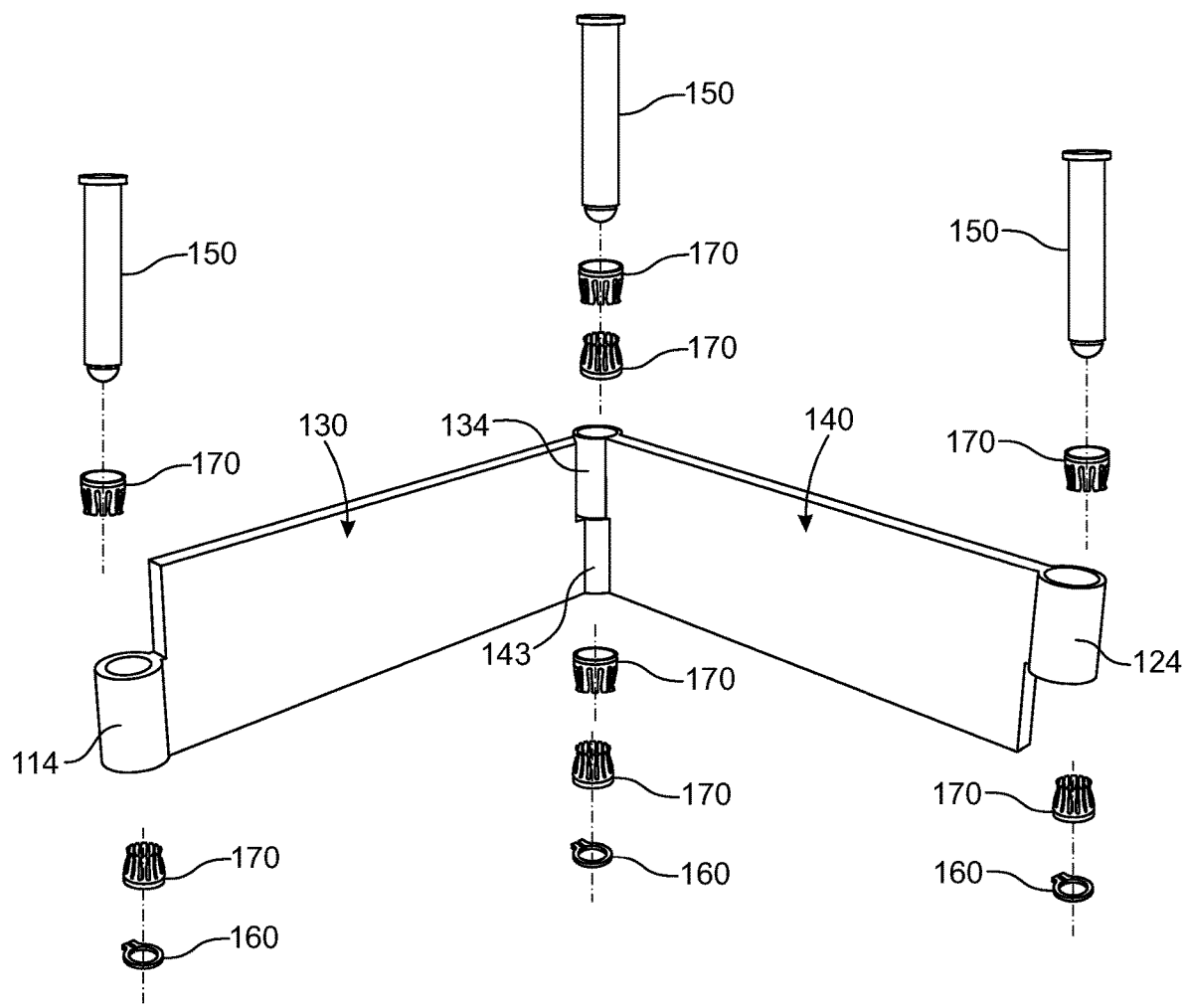
FIG. 15 depicts an exploded perspective view of a hinged busbar assembly which incorporates features of a fifth embodiment of the present disclosure.
Figure 16:
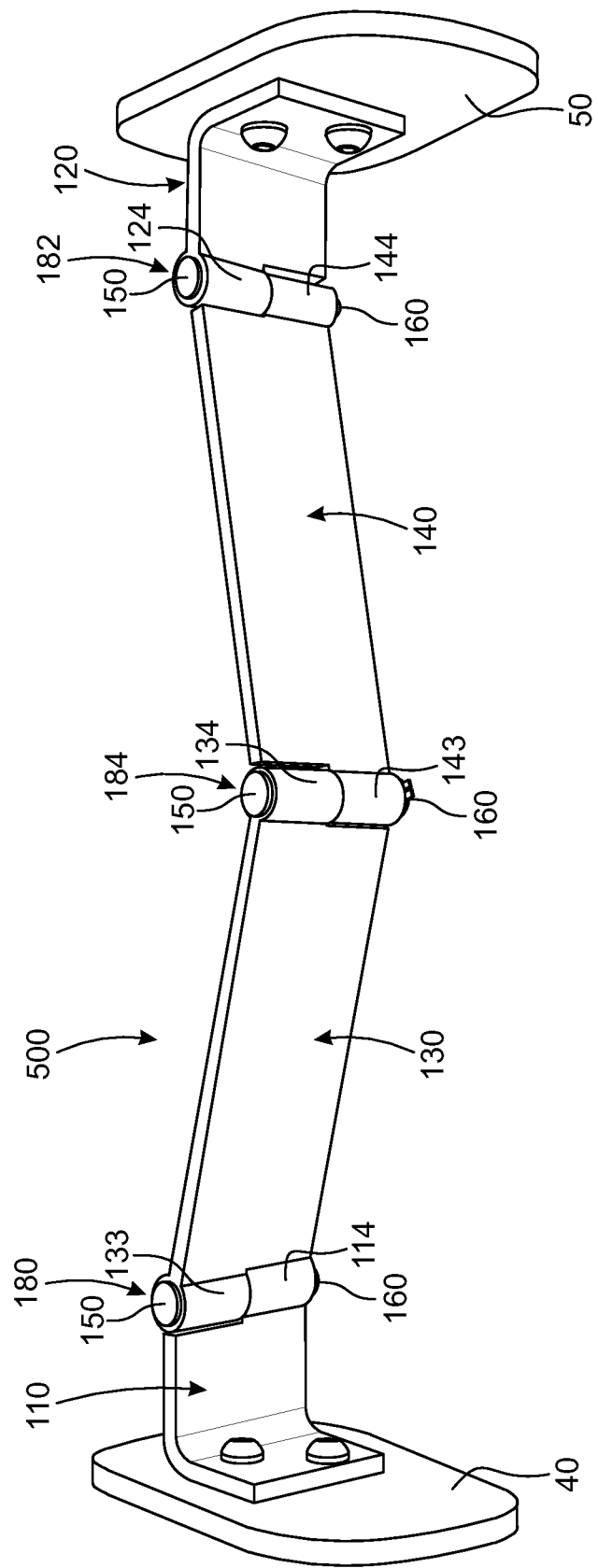
FIG. 16 depicts an assembled perspective view of the hinged busbar assembly of FIG. 15 mounted to the first component provided on the sliding insertable/extractable unit and mounted to the second component provided on the rack mounted hardware.

FIGS. 15 and 16 illustrate a fifth embodiment of the hinged busbar assembly 500. The hinged busbar assembly 500 is identical to the hinged busbar assembly 100 except that the generally cylindrical extensions 114, 124, 133, 134, 143, 144 are enlarged so that each cylindrical extension 114, 124, 133, 134, 143, 144 mounts a pair of electrical contacts 170 therein. The use of a pair of electrical contacts 170 in each cylindrical extension 114, 124, 133, 134, 143, 144 allows for a higher current capacity versus a single electrical contact.

Figure 17:
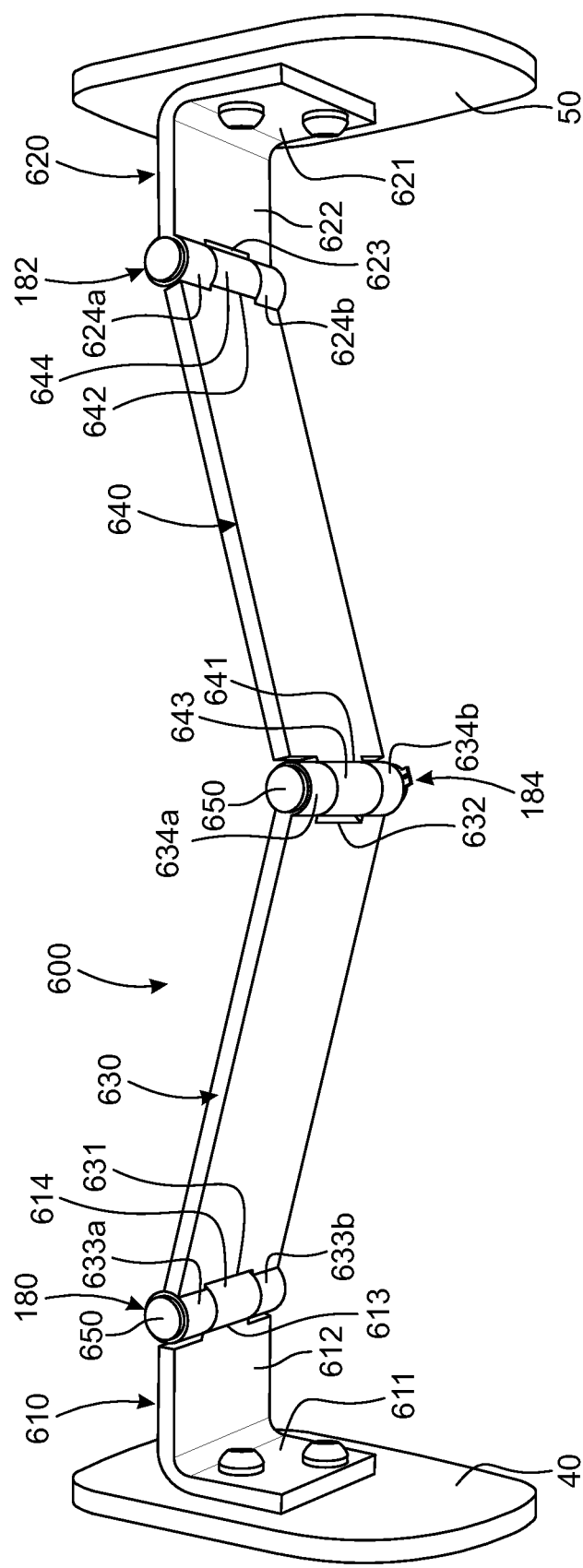
FIG. 17 depicts a perspective view of a hinged busbar assembly which incorporates features of a sixth embodiment of the present disclosure mounted to a first component provided on the sliding insertable/extractable unit and mounted to a second component provided on the rack mounted hardware.

FIG. 17 illustrates a sixth embodiment of the hinged busbar assembly 600. The hinged busbar assembly 600 includes first and second mounting busbars 610, 620, first and second extension busbars 630, 640, three pins 650, three retention clips 160 (not shown), and twelve electrical contacts 170 (not shown).

The mounting busbars 610, 620 may take a variety of forms.

In a first embodiment as shown in FIG. 17, the first mounting busbar 610 is generally L-shaped in configuration and has a first leg 611 which is secured by appropriate means, e.g., bolt, screw, rivet, etc. to the first component 40 at a fixed connection, and a second leg 612 which extends generally perpendicular to the first leg 611. The second leg 612 has a free end 613. A generally cylindrical extension 614 extends outwardly from a middle portion of the free end 613. The generally cylindrical extension 614 has an aperture (not shown) provided therethrough which defines an internal wall (not shown) of the generally cylindrical extension 614. The second mounting busbar 620 is generally L-shaped in configuration and has a first leg 621 which is secured by appropriate means, e.g., bolt, screw, rivet, etc. to the second component 50 at a fixed connection, and a second leg 622 which extends generally perpendicular to the first leg 621. The second leg 622 has a free end 623. First and second generally cylindrical extensions 624a, 624b extend outwardly from upper and lower portions, respectively, of the free end 623. Each generally cylindrical extension 624a, 624b has an aperture (not shown) provided therethrough which defines an internal wall (not shown) of the generally cylindrical extensions 624a, 624b

Alternatively, the mounting busbars 610, 620 may take the forms shown in FIGS. 4-7.

The first extension busbar 630 is generally straight in configuration and has a first free end 631 and a second, opposite free end 632. The sides of the first extension busbar 630 between the ends 631, 632 may be planar or may have the embossments as shown in FIG. 8 thereon. First and second generally cylindrical extensions 633a, 633b extend outwardly from upper and lower portions, respectively of the free end 631 and generally cylindrical extensions 634a, 634b extend outwardly from a upper and lower portions, respectively of the second free end 632. Each of the generally cylindrical extensions 633a, 633b, 634a, 634b have an aperture (not shown) provided therethrough which defines an internal wall (not shown) of the generally cylindrical extensions 633a, 633b, 634a, 634b. The generally cylindrical extension 614 of the first mounting busbar 610 is positioned between the generally cylindrical extensions 633a, 633b of the first extension busbar 630 such that the apertures thereof are in alignment with one another.

The second extension busbar 640 has a first free end 641 and a second, opposite free end 642. The sides of the second extension busbar 640 between the ends 641, 642 may be planar or may have the embossments as shown in FIG. 8 thereon. A generally cylindrical extension 643 extends outwardly from a middle portion of the first free end 641 and a generally cylindrical extension 644 extends outwardly from a middle portion of the second free end 642. Each of the generally cylindrical extensions 643, 644 have an aperture (not shown) provided therethrough which defines an internal wall (not shown) of the generally cylindrical extensions 643, 644. The generally cylindrical extension 643 of the second extension busbar 640 is positioned between the generally cylindrical extensions 634a, 634b of the first extension busbar 630 such that the apertures thereof are in alignment with one another. The generally cylindrical extension 644 of the second extension busbar 640 is positioned between the generally cylindrical extensions 624a, 624b of the second mounting busbar 620 such that the apertures thereof are in alignment with one another.

Each cylindrical extension 624a, 624b, 633a, 633b, 634a, 634b has one of the electrical contacts 170 secured within the respective aperture to the respective inner wall. Each cylindrical extension 614, 643, 644 has a pair of the electrical contacts 170 secured within the respective aperture to the respective inner wall. The use of a pair of electrical contacts 170 in each cylindrical extension 614, 643, 644 allows for a higher current capacity versus a single electrical contact.

The first connection 180 is formed by inserting one of the pins 150 through the aligned apertures and electrical contacts 170 of the cylindrical extensions 614, 633a, 633b of the first mounting busbar 610 and the first extension busbar 630 and being secured in place by one of the retention clips 160, thus both mechanically and electrically connecting the first mounting busbar 610 and the first extension busbar 630. It is to be understood that the cylindrical extensions 633a, 633b could instead extend from the first mounting busbar 610, and the cylindrical extension 614 could instead extend from the first extension busbar 630 to form the first connection 180. The second connection 182 is formed by inserting a second one of the pins 150 through the aligned apertures and electrical contacts 170 of the cylindrical extensions 624a, 624b, 644 of the second mounting busbar 620 and the second extension busbar 640 and being secured in place by one of the retention clips 160, thus both mechanically and electrically connecting the second mounting busbar 620 and the second extension busbar 640. It is to be understood that the cylindrical extensions 624a, 624b could instead extend from the second extension busbar 640, and the cylindrical extension 644 could instead extend from the second mounting busbar 620 to form the second connection 182.

The third connection 184 is formed by inserting a third one of the pins 150 through the aligned apertures and electrical contacts 170 of the cylindrical extensions 634a, 634b, 643 of the first and second extension busbars 630, 640 and being secured in place by one of the retention clips 160, thus both mechanically and electrically connecting the first and second extension busbars 630, 640 at the third connection 184. It is to be understood that the cylindrical extensions 634a, 634b could instead extend from the second extension busbar 640, and the cylindrical extension 643 could instead extend from the first extension busbar 630 to form the third connection 184. The first, second and third connections 180, 182, 184 thus act like hinges such that the first and second extension busbars 630, 640 can rotate about same, all while keeping an electrical connection.

Figure 18:
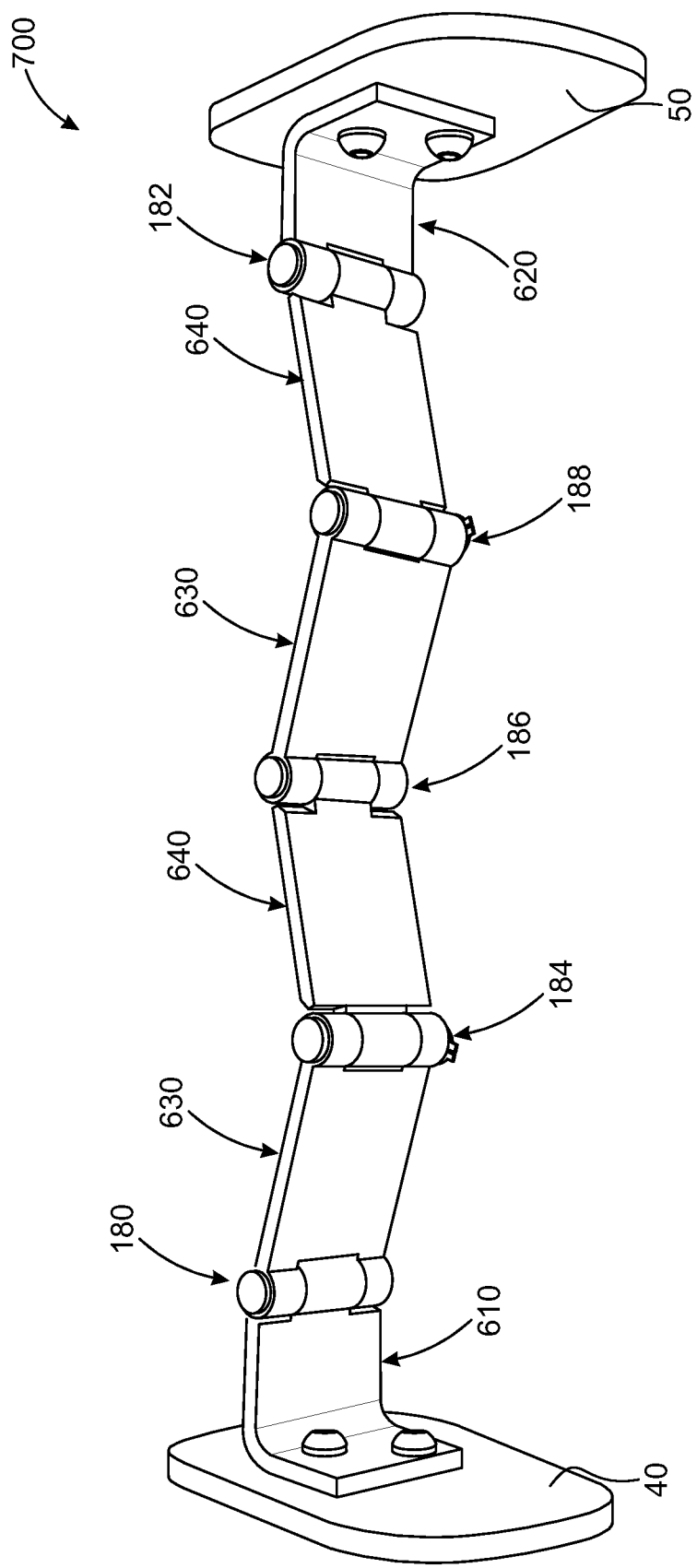
FIG. 18 depicts a perspective view of a hinged busbar assembly which incorporates features of a seventh embodiment of the present disclosure mounted to a first component provided on the sliding insertable/extractable unit and mounted to a second component provided on the rack mounted hardware.

FIG. 18 illustrates a seventh embodiment of the hinged busbar assembly 700. The hinged busbar assembly 700 is identical to the hinged busbar assembly 600 except that a pair of first extension busbars 630 and a pair of second extension busbars 640 are provided (as well as the associated/required pins 150, retention clips 160 and electrical contacts 170). Thus, the hinged busbar assembly 700 is configured to have, in order, the first mounting busbar 610, a first one of the first extension busbars 630, a first one of the second extension busbars 640, a second one of the first extension busbars 630 (with a fourth pivotal connection 186 provided therebetween), a second one of the second extension busbars 640 (with a fifth pivotal connection 188 provided therebetween), and the second mounting busbar 620. The connections 180, 182, 184, 186, 188 thus act like hinges such that the first and second extension busbars 630, 640 can rotate about same, all while keeping an electrical connection. It is to be understood that the embodiments of FIGS. 2-17 could also have multiple extension busbars.

Figure 19:
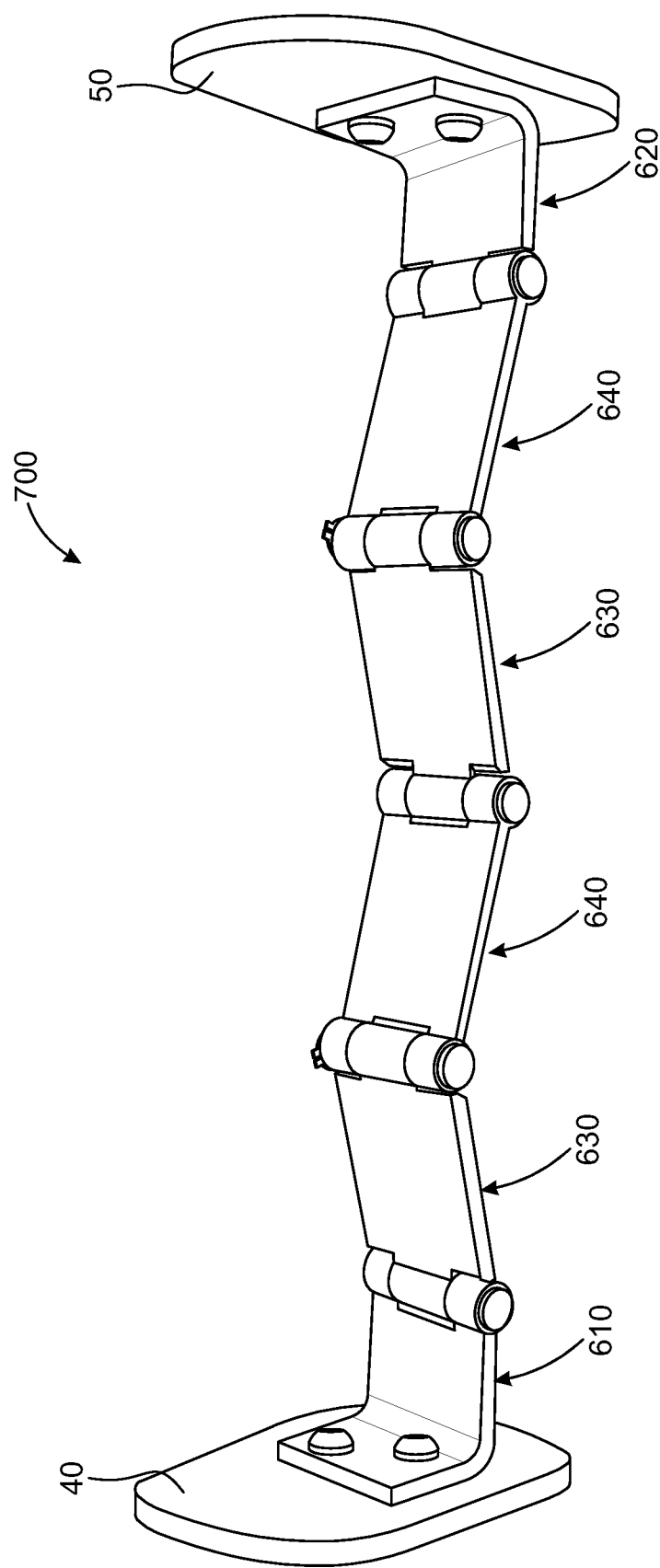
FIG. 19 depicts a perspective view of the hinged busbar assembly of FIG. 18 in a different orientation than that shown in FIG. 18.

FIG. 19 illustrates the hinged busbar assembly 700 in a horizontal orientation. When the hinged busbar assembly 700 pivots around the pivotal connections 180, 182, 184, 186, 188, the hinged busbar assembly 700 folds up on itself. Whereas FIGS. 2-18 illustrate each hinged busbar assembly 100, 200, 300, 400, 500, 600, 700 in a vertical orientation, it is to be understood that the hinged busbar assemblies 100, 200, 300, 400, 500, 600, 700 could also be provided in a horizontal orientation like that shown in FIG. 19.

Figure 20:
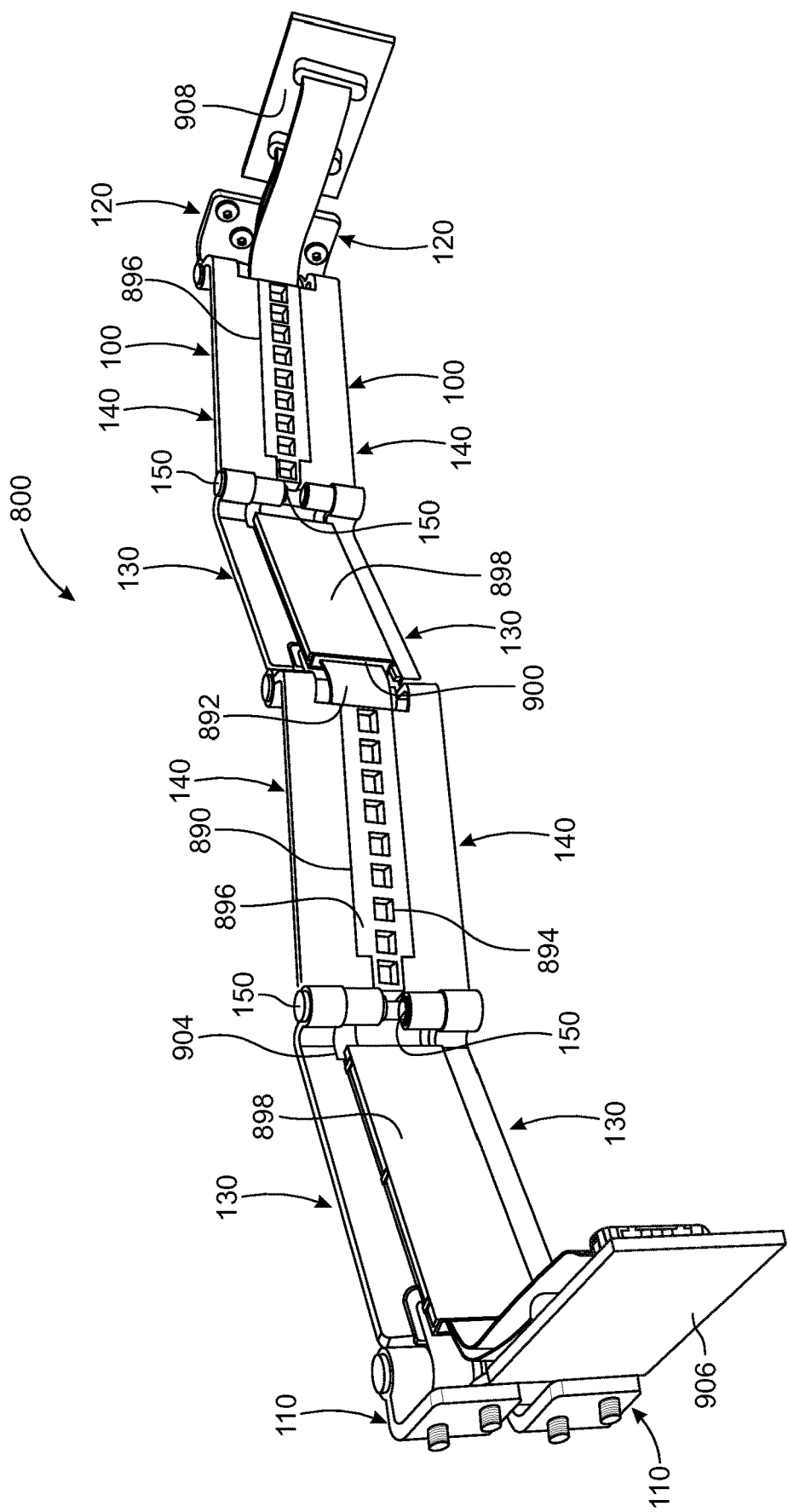
FIG. 20 depicts a perspective view of a hinged busbar assembly which incorporates features of an eighth embodiment of the present disclosure mounted to a first component provided on the sliding insertable/extractable unit and mounted to a second component provided on the rack mounted hardware.

FIG. 20 illustrate an eighth embodiment of the hinged busbar assembly 800. The eighth embodiment of the hinged busbar assembly 800 is identical to the hinged busbar assembly 300, 400 of FIG. 12 or 14, except that the insulative securement devices 890 also provide for carrying a cable 892 through the hinged busbar assembly 800 and that multiple extension busbars 130, 140 are provided between the mounting busbars 110, 120. While multiple extension busbars 130, 140 are shown, only a pair of extension busbars 130, 140 may be provided. The hinged busbar assembly 300 of FIG. 12 is shown in the embodiment of FIG. 20 and like reference numerals are used therein.

Each securement device 890 is insulative and secures the hinged busbar assemblies 100 in position together, thereby ensuring that the hinged busbar assemblies 100 rotate together. Each securement device 890 is positioned within the space between the busbar assemblies 100 to secure them in position together, thereby ensuring that each of the hinged busbar assemblies 200 will rotate together. Each securement device 890 is generally H-shaped having a cross-bar 894 which extends through the space between the extension busbars 130, a first part 896 which extends from a first end of the cross-bar 894 and a second part 898 which extends from a second, opposite end of the cross-bar 894. The cross-bar 894 extends from a middle of the first part 896 and a middle of the second part 898. The cross-bar 894 may be formed of a plurality of adjacent parallel ribs. The second part 898 of each securement device 890 has a central passageway 900 that extends between the opposite ends of the securement device 890.

The eighth embodiment of the hinged busbar assembly 800 further includes the cable 892, which in an embodiment is a twin axial cable, extends along the length of the hinged busbar assembly 800. The cable 892 is used to carry signals, such as high-speed signals, between the components 40, 50. Alternatively, the cable 892 can be used to carry power between the components 40, 50. Alternatively, the cable 892 can be used to carry signals and power between the components 40, 50.

In an embodiment, the securement devices 890 are reversed in adjacent extension busbars 130, 140, such that the first part 896 of the securement device 890 provided on the extension busbar 130 is adjacent to the second part 898 of the securement device 890 provided on the extension busbar 140; and such that the second part 898 of the securement device 890 provided on the extension busbar 130 is adjacent to the first part 896 of the securement device 890 provided on the extension busbar 140. The cable 892 extends through each central passageway 900 and also extends through a recess 904 in each extension busbar 130, 140 proximate to ends of the securement devices 890. Thus, in this embodiment, the cable 892 "snakes" through the hinged busbar assembly 800 such that the cable 892 passes along one side of the hinged busbar assembly 800 along the extension busbars 130 and then along the opposite side of the hinged busbar assembly 800 along the extension busbars 140. In another embodiment, the securement devices 890 are all orientated in the same direction such that the first part 896 of the securement device 890 provided on the extension busbar 130 is adjacent to the first part 896 of the securement device 890 provided on the extension busbar 140 and the second part 898 of the securement device 890 provided on the extension busbar 130 is adjacent to the second part 898 of the securement device 890 provided on the extension busbar 140. The cable 892 extends through each central passageway 900 along the same side of the hinged busbar assembly 800. In this embodiment, the recesses 904 can be eliminated.

A printed circuit board 906 is mounted on the first component 40 (not shown in FIG. 20) and may be proximate to the first mounting busbar 110. A printed circuit board 908 is mounted on the second component 50 (not shown in FIG. 20) and may be proximate to the second mounting busbar 120. As an example, each printed circuit board 906, 908 may be a 16 DP Robust NearStack Module—144 DP 34 AWG TwinAx—9 connector. The ends of the cable 892 are suitably connected to the printed circuit board 906, 908 at connectors. It is to be understood that while a single cable 892 with its connectors and a printed circuit board 906, 908 at each end is provided, multiple cables 892, connectors, and associated printed circuit boards 906, 908 can be routed through the central passageway 900 of the securement devices 890 to provide additional electrical transmission abilities to be accommodated.

All of the busbars 130, 140, 630, 640 described herein will all also preferably have power-coat insulation applied thereto.

While retention clips 160 are provided as the means to secure the pins 150 in place, other suitable retention means can be used as desired/allowed.

Also, the following examples are provided, which are numbered for easier reference.

1. A hinged busbar assembly for providing an electrical connection between first and second components comprising: a first mounting busbar configured to be electrically and mechanically connected to the first component at a fixed connection; a second mounting busbar configured to be electrically and mechanically connected to the second component at a fixed connection; and at least two extension busbars extending between the first and second mounting busbars, wherein adjacent extension busbars are electrically and mechanically connected to each other at a pivotal connection.

2. The hinged busbar assembly of example 1, wherein each pivotal connection includes at least one extension extending from each adjacent busbar and at least one electrical contact mounted in each extension, and a pin inserted through the electrical contacts.

3. The hinged busbar assembly of example 2, wherein each extension is cylindrical.

4. The hinged busbar assembly of example 1, wherein each electrical contact is a spring contact.

5. The hinged busbar assembly of example 1, wherein at least one of the first and second mounting busbars is L-shaped, and wherein each pivotal connection includes at least one extension extending from each adjacent busbar and at least one electrical contact mounted in each extension, and a pin inserted through the electrical contacts 6. The hinged busbar assembly of example 1, wherein at least one of the first and second mounting busbars is formed as a planar plate, and wherein each pivotal connection includes at least one extension extending from each adjacent busbar and at least one electrical contact mounted in each extension, and a pin inserted through the electrical contacts, and the at least one extension extending from the at least one of the first and second mounting busbars extends from a middle of the plate.

7. The hinged busbar assembly of example 1, wherein at least one of the first and second mounting busbars is formed as a planar plate, wherein each pivotal connection includes at least one extension extending from each adjacent busbar and at least one electrical contact mounted in each extension, and a pin inserted through the electrical contact, and the at least one extension extending from the at least one of the first and second mounting busbars extends from an edge of the plate.

8. The hinged busbar assembly of example 1, wherein at least one of the busbars has an embossment extending along at least a portion of a length thereof.

9. The hinged busbar assembly of example 1, further comprising a third mounting busbar configured to be electrically and mechanically connected to the first component at a fixed connection; a fourth mounting busbar configured to be electrically and mechanically connected to the second component at a fixed connection; and at least two extension busbars extending between the third and fourth mounting busbars, wherein adjacent extension busbars extending between the third and fourth mounting busbars are electrically and mechanically connected to each other at a pivotal connection.

10. The hinged busbar assembly of example 9, further comprising a first insulative securement device connected between one of the extension busbars extending between the first and second mounting busbars and one of one of the extension busbars extending between the third and fourth mounting busbars, and a second insulative securement device connected between a second one of the extension busbars extending between the first and second mounting busbars and a second one of one of the extension busbars extending between the third and fourth mounting busbars.

11. The hinged busbar assembly of example 10, wherein each securement device includes a passageway therethrough, and further comprising a cable extending through the passageways.

12. The hinged busbar assembly of example 10, wherein each securement device is generally H-shaped.

13. The hinged busbar assembly of example 12, wherein each securement device includes a passageway therethrough, and further comprising a cable extending through the passageways.

14. The hinged busbar assembly of example 9, further comprising a first insulative securement device extending around one of the extension busbars extending between the first and second mounting busbars and one of one of the extension busbars extending between the third and fourth mounting busbars, and a second insulative securement device extending around a second one of the extension busbars extending between the first and second mounting busbars and a second one of one of the extension busbars extending between the third and fourth mounting busbars.

15. An assembly comprising: a first component; a second component; and a hinged busbar assembly including a first mounting busbar electrically and mechanically connected to the first component at a first fixed connection, a second mounting busbar electrically and mechanically connected to the second component at a second fixed connection, and at least two extension busbars extending between the first and second mounting busbars, wherein adjacent extension busbars are electrically and mechanically connected to each other at a first pivotal connection, wherein one of the at least two extension busbars is electrically and mechanically connected to the first mounting busbar at a second pivotal connection, and wherein another one of the at least two extension busbars is electrically and mechanically connected to the second mounting busbar at a third pivotal connection.

16. The assembly of example 15, further comprising a sliding insertable/extractable unit to which the first component is mounted, and a rack mounted hardware to which the second component is mounted.

17. The assembly of example 15, wherein the first component is one of a midplane, a backplane, a daughter card and a chassis, and the second component is one of a midplane, a backplane, a daughter card and a chassis.

18. The hinged busbar assembly of example 15, wherein each pivotal connection includes at least one extension extending from each adjacent busbar and at least one electrical contact mounted in each extension, and a pin inserted through the electrical contacts.

19. The assembly of example 15, further comprising a second hinged busbar assembly including a third mounting busbar electrically and mechanically connected to the first component at a third fixed connection, a fourth mounting busbar electrically and mechanically connected to the second component at a fourth fixed connection, and at least two extension busbars extending between the third and fourth mounting busbars, wherein adjacent extension busbars of the second hinged busbar assembly are electrically and mechanically connected to each other at a fourth pivotal connection, wherein one of the at least two extension busbars is electrically and mechanically connected to the third mounting busbar at a fifth pivotal connection, and wherein another one of the at least two extension busbars is electrically and mechanically connected to the fourth mounting busbar at a sixth pivotal connection.

20. The assembly of example 19, further comprising a first insulative securement device connected between one of the extension busbars of the first defined hinged busbar assembly and one of one of the extension busbars of the second hinged busbar assembly, and a second insulative securement device connected between a second one of the extension busbars of the first defined hinged busbar assembly and a second one of one of the extension busbars of the second hinged busbar assembly.

It will be understood that there are numerous modifications of the illustrated embodiments described above which will be readily apparent to one skilled in the art, such as, but not limited to, many variations and modifications of the number/placement of the electrical contacts 170, the number and configuration of busbars used, the number of connection locations provided, and combinations of features disclosed herein that are individually disclosed or claimed herein, explicitly including additional combinations of such features, or alternatively other types of busbars. Also, there are many possible variations in the materials and configurations.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A hinged busbar assembly for providing an electrical connection between first and second components comprising: a first mounting busbar configured to be electrically and mechanically connected to the first component at a first fixed connection; a second mounting busbar configured to be electrically and mechanically connected to the second component at a second fixed connection; and extension busbars extending between the first and second mounting busbars, adjacent extension busbars being electrically and mechanically connected to each other at a pivotal connection, each pivotal connection including a first extension extending from a first one of the adjacent extension busbars and having an electrical contact mounted therein, a second extension extending from a second one of the adjacent extension busbars and having an electrical contact mounted therein, the extensions in each pivotal connection being stacked one above the other and having a pin extending therethrough.

2. The hinged busbar assembly of claim 1, wherein each extension is cylindrical.

3. The hinged busbar assembly of claim 1, wherein each electrical contact is a spring contact.

4. The hinged busbar assembly of claim 1, wherein at least one of the first mounting busbar, the second mounting busbar or the extension busbars has an embossment extending along at least a portion of a length thereof.

5. The hinged busbar assembly of claim 1, further comprising a third mounting busbar configured to be electrically and mechanically connected to the first component at a fixed connection; a fourth mounting busbar configured to be electrically and mechanically connected to the second component at a fixed connection; and extension busbars extending between the third and fourth mounting busbars, adjacent extension busbars extending between the third and fourth mounting busbars being electrically and mechanically connected to each other at a pivotal connection including an extension extending from a first one of the adjacent extension busbars extending between the third and fourth mounting busbars and having an electrical contact mounted therein, an extension extending from a second one of the adjacent extension busbars extending between the third and fourth mounting busbars and having an electrical contact mounted therein, wherein in each pivotal connection between the third and fourth mounting busbars the extensions are stacked one above the other and have a pin extending therethrough.

6. The hinged busbar assembly of claim 5, further comprising a first insulative securement device extending around a first one of the extension busbars extending between the first and second mounting busbars and a first one of the extension busbars extending between the third and fourth mounting busbars, and a second insulative securement device extending around a second one of the extension busbars extending between the first and second mounting busbars and a second one of the extension busbars extending between the third and fourth mounting busbars.

7. The hinged busbar assembly of claim 1, wherein a first one of the extension busbars is electrically and mechanically connected to the first mounting busbar at a first pivotal connection, and a second one of the extension busbars is electrically and mechanically connected to the second mounting busbar at a second pivotal connection.

8. The hinged busbar assembly of claim 1,
wherein the first pivotal connection includes a first extension extending from the first mounting busbar and having an electrical contact mounted therein, a second extension extending from the first one of the extension busbars and having an electrical contact mounted therein, the extensions in the first pivotal connection being stacked one above the other and having a first pin extending therethrough, and
wherein the second pivotal connection includes a first extension extending from the second mounting busbar and having an electrical contact mounted therein, a second extension extending from the second one of the extension busbars and having an electrical contact mounted therein, the extensions in the second pivotal connection being stacked one above the other and having a second pin extending therethrough.

9. The hinged busbar assembly of claim 8, wherein the electrical contact in each of the first and second pivotal connections is a spring contact.

10. The hinged busbar assembly of claim 8, wherein at least one of the first and second mounting busbars is L-shaped, or is formed as a planar plate, and the extensions extending from the mounting busbars extend from a middle of the plate, or is formed as a planar plate, and the extensions extending from the mounting busbars extend from an edge of the respective plate.

11. A hinged busbar assembly for providing an electrical connection between first and second components comprising: a first mounting busbar configured to be electrically and mechanically connected to the first component at a first fixed connection; a second mounting busbar configured to be electrically and mechanically connected to the second component at a second fixed connection; two extension busbars extending between the first and second mounting busbars, adjacent extension busbars being electrically and mechanically connected to each other at a pivotal connection; a third mounting busbar configured to be electrically and mechanically connected to the first component at a fixed connection; a fourth mounting busbar configured to be electrically and mechanically connected to the second component at a fixed connection; two extension busbars extending between the third and fourth mounting busbars, adjacent extension busbars extending between the third and fourth mounting busbars being electrically and mechanically connected to each other at a pivotal connection; a first insulative securement device connected between a first one of the extension busbars extending between the first and second mounting busbars and a first one of the extension busbars extending between the third and fourth mounting busbars; and a second insulative securement device connected between a second one of the extension busbars extending between the first and second mounting busbars and a second one of the extension busbars extending between the third and fourth mounting busbars.

12. The hinged busbar assembly of claim 11, wherein the first securement device includes a passageway therethrough, and further comprising a first cable extending through the passageways and the second securement device includes a passageway therethrough, and further comprising a second cable extending through the passageways of the second securement device.

13. The hinged busbar assembly of claim 11, wherein the first securement device is generally H-shaped, and the second securement device is generally H-shaped.

14. The hinged busbar assembly of claim 13, wherein the first securement device includes a passageway therethrough, and further comprising a first cable extending through the passageways, and the second securement device includes a passageway therethrough, and further comprising a second cable extending through the passageways of the second securement device.

15. The hinged busbar assembly of claim 11, wherein each pivotal connection includes an extension extending from one of the adjacent extension busbars and having an electrical contact mounted therein, and an extension extending from the other of the adjacent extension busbars and having an electrical contact mounted therein, the extensions in each pivotal connection being stacked one above the other and having a pin extending therethrough.

16. An assembly comprising: a first component; a second component; and a hinged busbar assembly including a first mounting busbar electrically and mechanically connected to the first component at a first fixed connection, a second mounting busbar electrically and mechanically connected to the second component at a second fixed connection, and extension busbars extending between the first and second mounting busbars, wherein adjacent extension busbars are electrically and mechanically connected to each other at a pivotal connection, wherein a first one of the extension busbars is electrically and mechanically connected to the first mounting busbar at a first pivotal connection, and wherein another a second one of the extension busbars is electrically and mechanically connected to the second mounting busbar at a second pivotal connection, and each pivotal connection including a first extension extending from one of the adjacent busbars and having an electrical contact mounted therein, a second extension extending from the other of the adjacent busbars and having an electrical contact mounted therein, the extensions in each pivotal connection being stacked one above the other and having a pin extending therethrough.

17. The assembly of claim 16, further comprising a sliding insertable/extractable unit to which the first component is mounted, and a rack mounted hardware to which the second component is mounted.

18. The assembly of claim 16, wherein the first component is one of a midplane, a backplane, a daughter card or a chassis, and the second component is one of a midplane, a backplane, a daughter card or a chassis.

19. The assembly of claim 16, further comprising a second hinged busbar assembly including a third mounting busbar electrically and mechanically connected to the first component at a third fixed connection, a fourth mounting busbar electrically and mechanically connected to the second component at a fourth fixed connection, and at least two extension busbars extending between the third and fourth mounting busbars, wherein adjacent extension busbars of the second hinged busbar assembly are electrically and mechanically connected to each other at a fourth pivotal connection, wherein a first one of the at least two extension busbars is electrically and mechanically connected to the third mounting busbar at a fifth pivotal connection, and wherein a second one of the at least two extension busbars is electrically and mechanically connected to the fourth mounting busbar at a sixth pivotal connection.

20. The assembly of claim 19, wherein the hinged busbar assembly defines a first hinged busbar assembly, and further comprising a first insulative securement device connected between one of the extension busbars of the first defined hinged busbar assembly and one of one of the extension busbars of the second hinged busbar assembly, and a second insulative securement device connected between a second one of the extension busbars of the first defined hinged busbar assembly and a second one of one of the extension busbars of the second hinged busbar assembly.

\* \* \* \* \*